(12) United States Patent
Yoo et al.

(10) Patent No.: US 10,290,814 B2
(45) Date of Patent: *May 14, 2019

(54) ORGANIC LIGHT-EMITTING DIODE

(71) Applicant: LG DISPLAY CO., LTD., Seoul (KR)

(72) Inventors: Seonkeun Yoo, Gunpo-si (KR); Sunghoon Joo, Paju-si (KR); Jungkeun Kim, Seoul (KR); Dohan Kim, Goyang-si (KR); Jeongdae Seo, Incheon (KR); Hyoseok Kim, Goyang-si (KR); Hyeseung Kang, Seoul (KR); Jungsoo Park, Seoul (KR); Min Yun, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 427 days.

This patent is subject to a terminal disclaimer.

(21) Appl. No.: 14/673,078

(22) Filed: Mar. 30, 2015

(65) Prior Publication Data

US 2015/0280141 A1 Oct. 1, 2015

(30) Foreign Application Priority Data

Mar. 31, 2014 (KR) .................. 10-2014-0038217

(51) Int. Cl.
*H01L 51/00* (2006.01)
*C09K 11/02* (2006.01)
*H01L 51/50* (2006.01)
*H01L 51/52* (2006.01)

(52) U.S. Cl.
CPC ........ *H01L 51/0072* (2013.01); *C09K 11/025* (2013.01); *H01L 51/0052* (2013.01); *H01L 51/0056* (2013.01); *H01L 51/0058* (2013.01); *H01L 51/0067* (2013.01); *H01L 51/5012* (2013.01); *H01L 51/5044* (2013.01); *H01L 51/0085* (2013.01); *H01L 51/5072* (2013.01); *H01L 51/5092* (2013.01); *H01L 51/5278* (2013.01)

(58) Field of Classification Search
CPC ............. H01L 51/0072; H01L 51/5012; H01L 51/5044
USPC ..................................... 252/301.16
See application file for complete search history.

(56) References Cited

U.S. PATENT DOCUMENTS

| | | | | |
|---|---|---|---|---|
| 2012/0007063 A1* | 1/2012 | Langer | ................. | C07D 405/04 257/40 |
| 2012/0228598 A1* | 9/2012 | Yokoyama | ........... | C07D 471/04 257/40 |
| 2012/0326601 A1* | 12/2012 | Yasukawa | .............. | C09K 11/06 313/504 |
| 2013/0200360 A1* | 8/2013 | Oikawa | ................. | B82Y 20/00 257/40 |
| 2014/0061601 A1* | 3/2014 | Kim | ..................... | C07D 401/10 257/40 |
| 2016/0043327 A1* | 2/2016 | Yoo | ....................... | H01L 51/504 257/40 |

FOREIGN PATENT DOCUMENTS

| | | |
|---|---|---|
| CN | 102439746 A | 5/2012 |
| CN | 102712639 A | 10/2012 |
| CN | 103664746 A | 3/2014 |
| KR | 10-2013-0079237 A | 7/2013 |

OTHER PUBLICATIONS

CAS reg. No. 1811532-15-6, Oct. 20, 2015.*

* cited by examiner

*Primary Examiner* — Douglas J McGinty
(74) *Attorney, Agent, or Firm* — Dentons US LLP

(57) ABSTRACT

Disclosed is an organic light emitting diode. The organic light-emitting diode comprises at least one light-emitting part between an anode and a cathode, wherein the at least one light-emitting part has at least one organic layer and an emissive layer. The at least one organic layer is composed of a compound having one or more heteroatoms, and the compound has an energy level due to the heteroatoms and conductive characteristics due to the energy level.

21 Claims, 7 Drawing Sheets

(a)

(b)

(a)

(b)

(a)

(b)

ORGANIC LIGHT-EMITTING DIODE

This application claims the priority benefit of Korean Patent Application No. 10-2014-0038217 filed on Mar. 31, 2014, which is incorporated herein by reference for all purposes as if fully set forth herein.

BACKGROUND OF THE INVENTION

Field of the Invention

This disclosure relates to an organic light emitting diode. More particularly, the disclosure relates to an organic light emitting diode which can decrease driving voltage and improve lifetime by having an n type-charge generation layer (n-CGL) or electron transporting layer that is capable of injecting more electrons.

Discussion of the Related Art

In recent years, as the demand for flat panel displays is growing, organic light-emitting diode (OLED) devices are drawing attention. An OLED is a device that uses organic materials to convert electrical energy into light energy, and includes a layer of organic materials capable of emitting light, disposed between an anode and a cathode. OLEDs may form a variety of structures. Among those OLEDs, research on tandem organic light-emitting diodes with a plurality of emissive layers stacked is underway.

A tandem organic light-emitting diode is formed of a plurality of light-emitting parts, each having a hole injection layer, a hole transporting layer, an emissive layer, an electron transporting layer, and an electron injection layer stacked between an anode and a cathode. An n-type charge generation layer and a p-type charge generation layer are formed between each of the light-emitting parts of the tandem organic light-emitting diode. As electric charges are generated between the n-type charge generation layer and the p-type charge generation layer, electrons flow to the electron injection layer adjacent to the n-type charge generation layer, and holes are transported to the hole injection layer adjacent to the n-type charge generation layer. In this case, device efficiency depends on the interface characteristics and the difference in the energy level between the p-type charge generation layer and the n-type charge generation layer, and the interface characteristics and the difference in the energy level between the n-type charge generation layer and a doped alkali metal.

As the difference in energy level between the n-type charge generation layer and the p-type charge generation layer becomes larger, more charges are generated at the interface of the hole injection layer adjacent to the p-type charge generation layer, making electron injection into the n-type charge generation layer difficult.

Moreover, in the case of an n-type charge generation layer doped with an alkali metal, the alkali metal diffuses into the p-type charge generation layer, causing leakage current. The leakage current decreases the lifetime of the device.

A related art example of a compound for an organic photoelectronic device, an organic light-emitting diode including the same, and a display including the organic light emitting diode is provided in Korean Laid-Open Patent No. 2013-0079237.

SUMMARY OF THE INVENTION

Accordingly, the present invention is directed to an organic light-emitting diode that substantially obviates one or more of the problems due to limitations and disadvantages of the related art.

An advantage of the present invention is to provide an organic light-emitting diode comprising at least one light-emitting part between an anode and a cathode, and comprising at least one organic layer and an emissive layer. The at least one organic layer being composed of a compound having one or more heteroatoms, and the compound having an energy level due to the heteroatoms and conductive characteristics due to the energy level.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
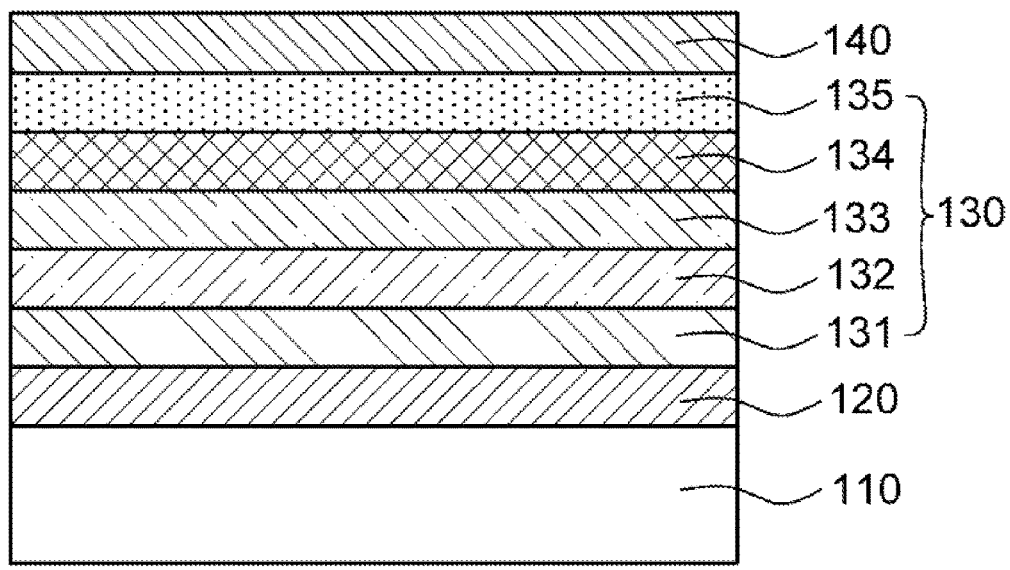
FIG. 1 is a cross-sectional view of an organic light-emitting diode according to an exemplary embodiment of the present invention.

Advantages and features of the present invention and methods of accomplishing the same may be understood more readily by reference to the following detailed description of the embodiments and the accompanying drawings. However, the present invention may be embodied in many different forms, and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element or layer is referred to as being "on" another element or layer, the element or layer can be directly on another element or layer or intervening elements or layers.

It will be understood that, although the terms first, second, third, etc., may be used herein to describe various elements, these elements should not be limited by these terms. These terms are only used to distinguish one element from another element. Thus, a first element discussed below could be termed a second element without departing from the technical spirit of the present invention.

Like reference numerals refer to like components throughout the specification.

The sizes and thicknesses of the components shown in the drawings are illustrated for explanatory convenience, but the present invention is not necessarily limited thereto.

The features of various exemplary embodiments of the present invention may be combined with one another either partly or wholly, and may technically interact or work together in various ways, as will be fully understood by those skilled in the art. The exemplary embodiments may be carried out independently or in combination with one another.

As used herein, the term "substitution" refers to, unless separately defined, the replacement of at least one hydrogen atom in a substituent or compound with a deuterium, a halogen group, a hydroxy group, an amino group, a substituted or unsubstituted C1-C30 amine group, a nitro group, a substituted or unsubstituted C3-C40 silyl group, a C1-C30 alkyl group, a C1-C10 alkylsilyl group, a C3-C30 cycloalkyl group, a C6-C30 aryl group, or a C1-C30 alkoxy group.

Hereinafter, various exemplary embodiments of the present invention will be described in detail with reference to the accompanying drawings.

A compound according to an exemplary embodiment of the present invention is represented by the following Chemical Formula 1:

[Chemical Formula 1]

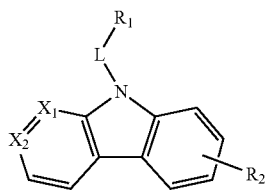

where X1 and X2 are carbon or nitrogen, and at least one of X1 and X2 is nitrogen. Although not theoretically limited, at least one of $X_1$ and $X_2$ is nitrogen and when the compound is doped with an alkali metal, a chemical bond may be partially formed between non-covalent electron pairs of the nitrogen and the alkali metal. For example, in the case of an n-type charge generation layer formed of a compound and doped with an alkali metal, diffusion of the alkali metal into a p-type charge generation layer from the n-type charge generation layer is minimized, thereby improving the lifetime of the organic light-emitting diode. Moreover, the compound includes one or more heteroatoms, and the compound having an energy level due to the heteroatoms and conductive characteristics due to the energy level. That is, because at least one of $X_1$ and $X_2$ is nitrogen, the compound has conductive characteristics depending on the LUMO (Lowest Unoccupied Molecular Orbital) energy level, facilitating electron injection into an electron transporting layer. When N of Chemical Formula 1 in the same ring is substituted with a nitrogen atom farther than at least one of $X_1$ and $X_2$, the above-described advantages will be decreased. And, a nitrogen atom substituted at a position closer than at least one of $X_1$ and $X_2$ facilitates the electron transfer or the electron injection to the charge generation layer or the electron transporting layer, compared to a nitrogen atom substituted at a position farther than at least one of $X_1$ and $X_2$.

L is a single bond, a substituted or unsubstituted C1 to C60 arylene group, or a substituted or unsubstituted 5-membered to 60-membered heteroarylene group having one or more heteroatoms selected from nitrogen, oxygen, and sulfur $R_1$ is a substituted or unsubstituted C6 to C60 aryl group, a substituted or unsubstituted 5-membered to 60-membered heteroaryl group having one or more heteroatoms selected from nitrogen, oxygen, and sulfur, or a C1 to C20 alkyl group.

$R_2$ is hydrogen, a substituted or unsubstituted C6 to C60 aryl group, a substituted or unsubstituted 5-membered to 60-membered heteroaryl group having one or more heteroatoms selected from nitrogen, oxygen, and sulfur, an arylamine group, or a secondary amine group.

$R_1$ or $R_2$ may be a substituted or unsubstituted 5- to 60-membered heteroaryl group having heteroatoms. The heteroatoms may be selected from nitrogen, oxygen, and sulfur. Preferably, the heteroatoms may be nitrogen. Since $R_1$ or $R_2$ may include nitrogen atoms, a chemical bond may be partially formed between non-covalent electron pairs of nitrogen and the alkali metal. Hence, the aforementioned conductive characteristics is improved, and diffusion of the doped alkali metal into a p-type charge generation layer from the n-type charge generation layer is reduced. When $R_1$ or $R_2$ is a heteroaryl group having nitrogen heteroatoms, this facilitates synthesis and improves the lifetime of organic light-emitting diodes, compared to a heteroaryl group having other atoms.

The L, $R_1$, or $R_2$ may be selectively adjusted to determine the entire conjugation length of the compound, and the crystallinity and solubility of the compound may be adjusted depending on the binding position. Also, when the L, $R_1$, or $R_2$ is a reactive group having one or more heteroatoms, the amount of electron injection into an emissive layer or an electron transporting layer may be adjusted.

Moreover, when the crystallinity and solubility of the compound become sufficiently high by the $R_1$ or $R_2$, the L may be a single bond. When the L is a single bond, the compound may have a lower molecular weight and hence the deposition temperature may be reduced, thus improving operability in the production of organic light-emitting diodes.

As well as an increase in the amount of electron injection, high stability and high thermal stability of the layer may be achieved.

And, the organic light-emitting display device, to which the organic layer including the compound is applied, is further improved than the organic light-emitting display device, to which an organic layer not including the compound is applied, in the electron injection of the anode direction or the hole injection of the cathode direction and relatively increases the emission efficiency and the lifetime.

The compound may be, but not limited to, any one of the following compounds represented by 1-1 to 1-102.

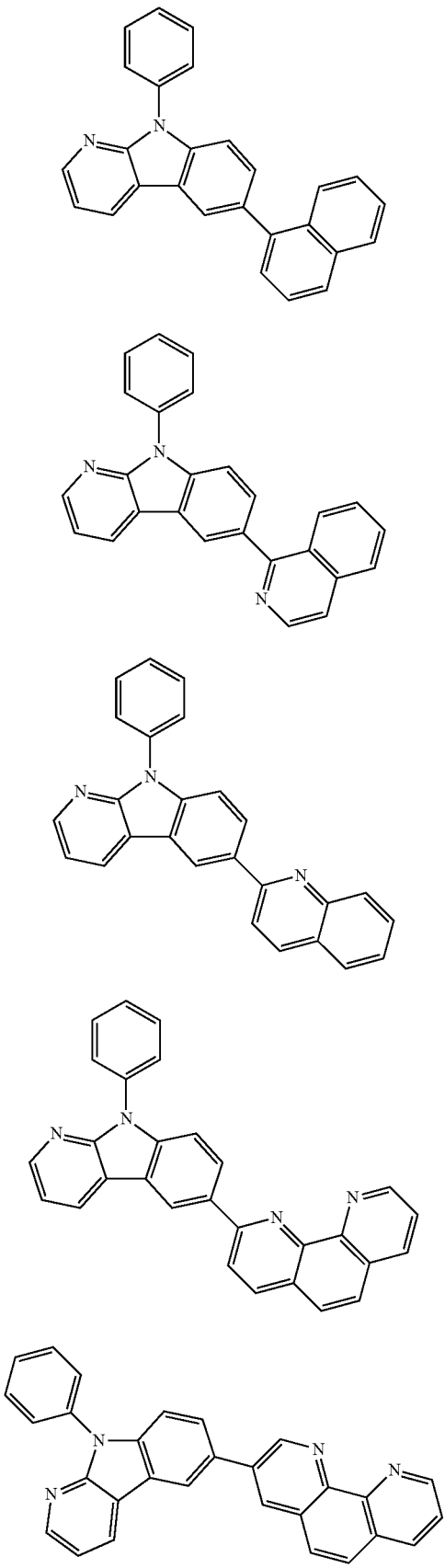
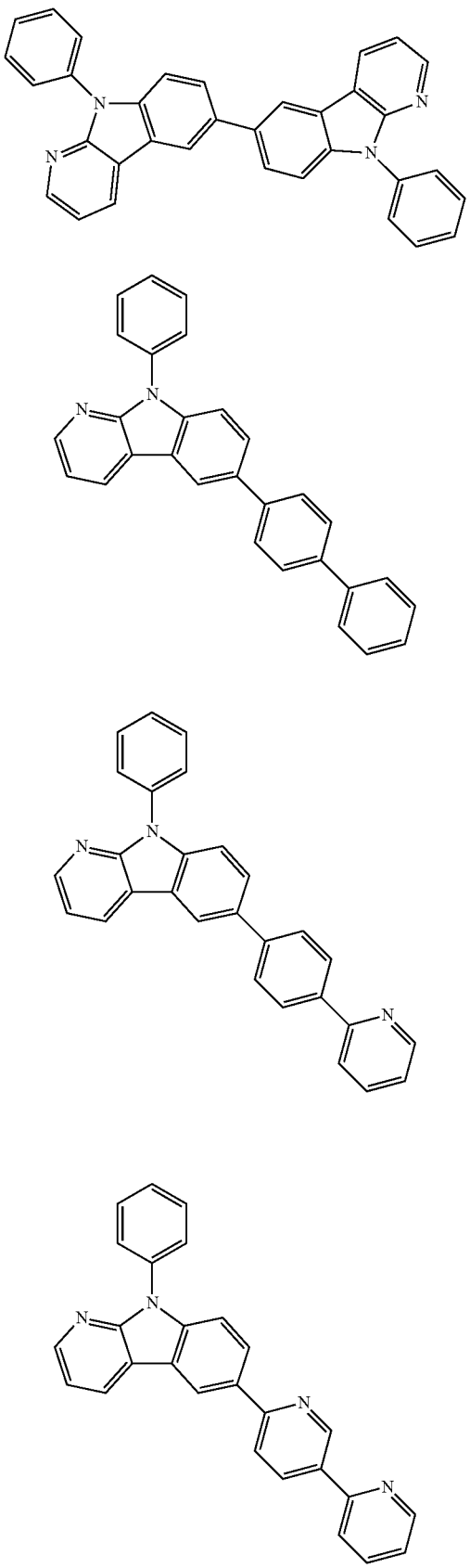

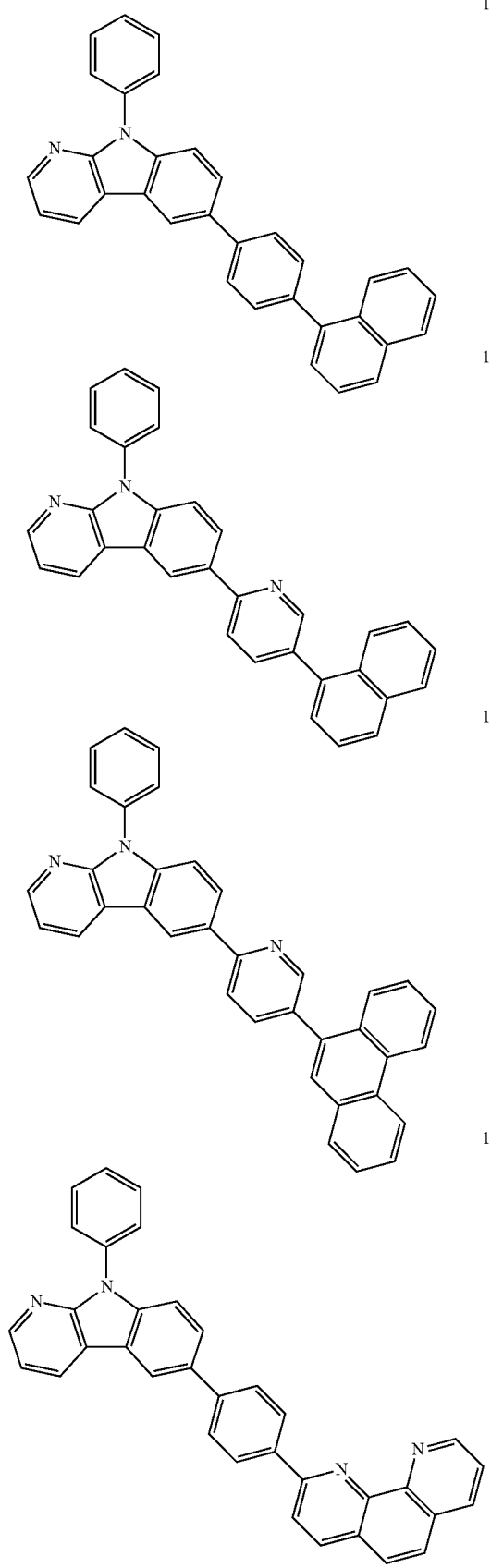
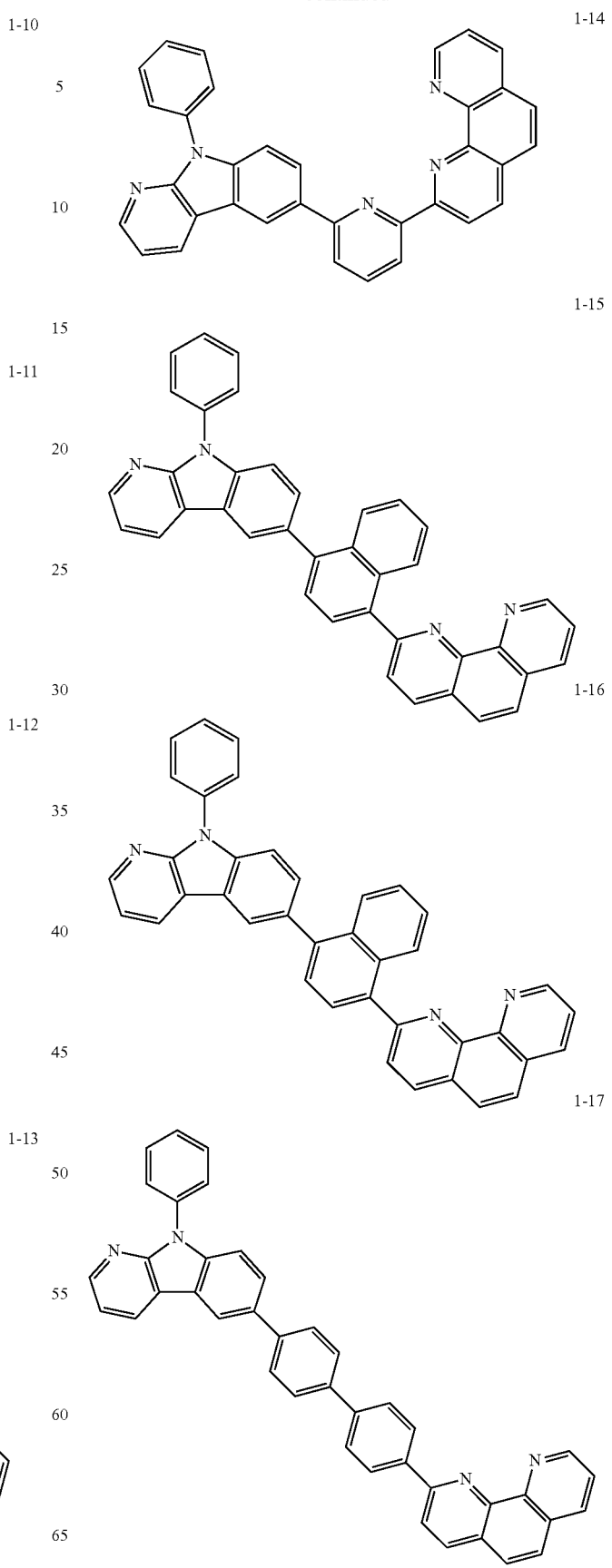

1-18
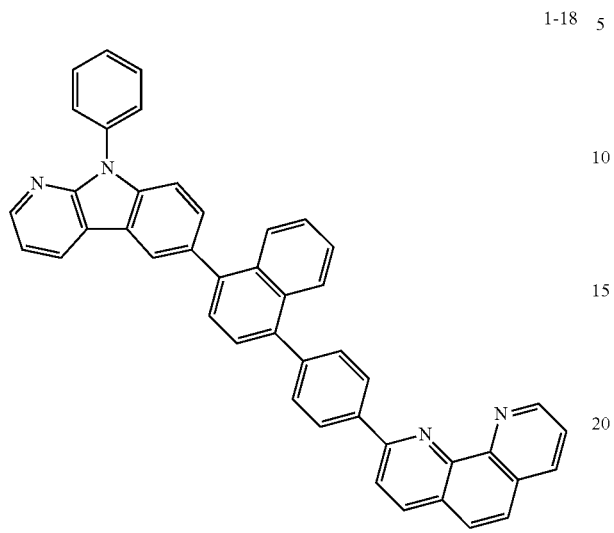
1-19
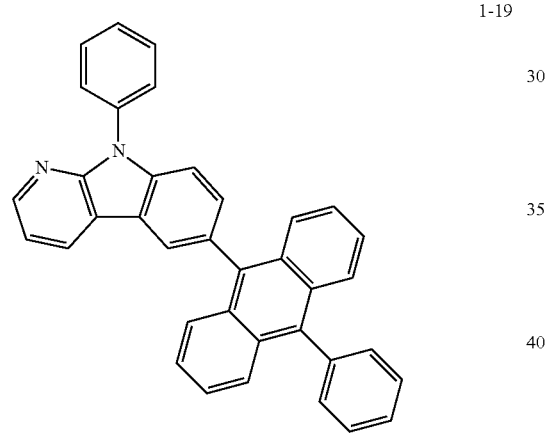
1-20
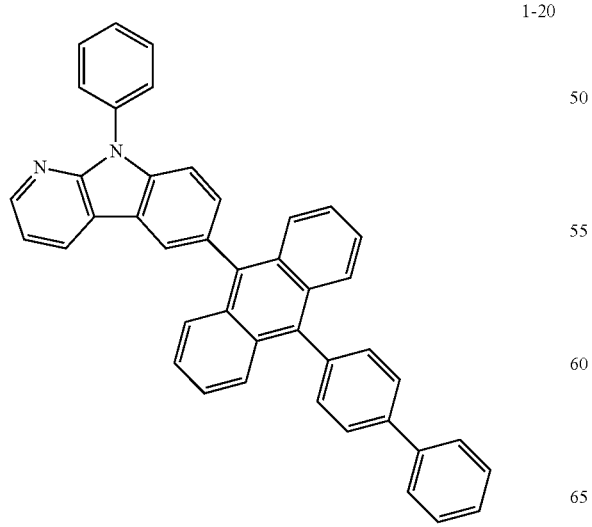
1-21
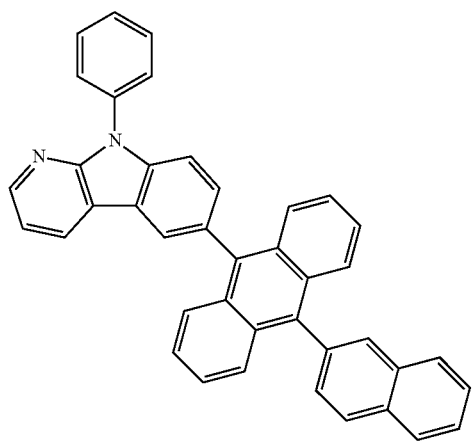
1-22
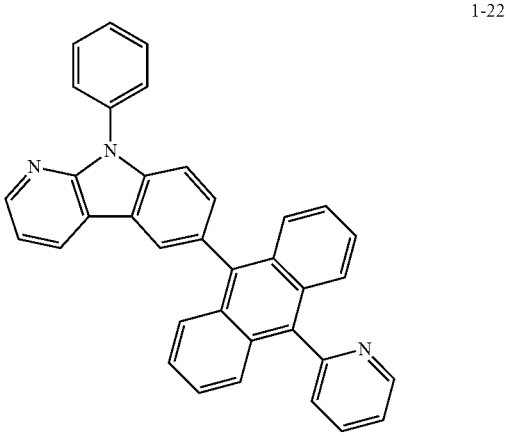
1-23
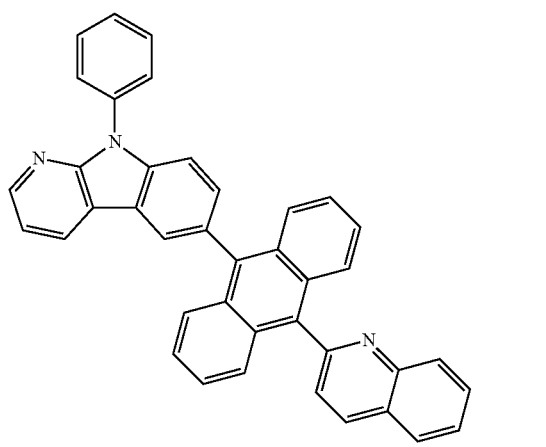

1-24
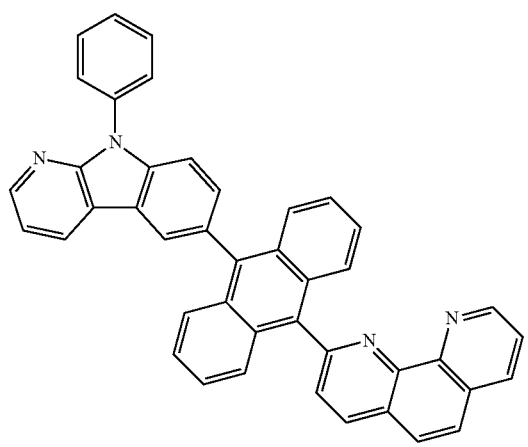
1-25
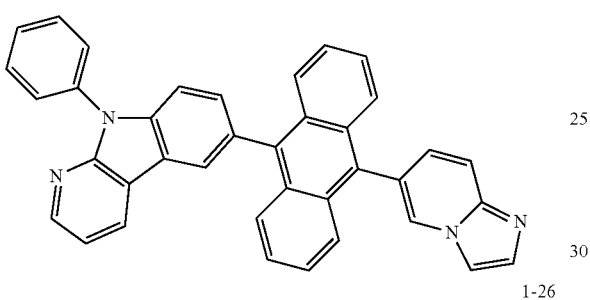
1-26
1-27
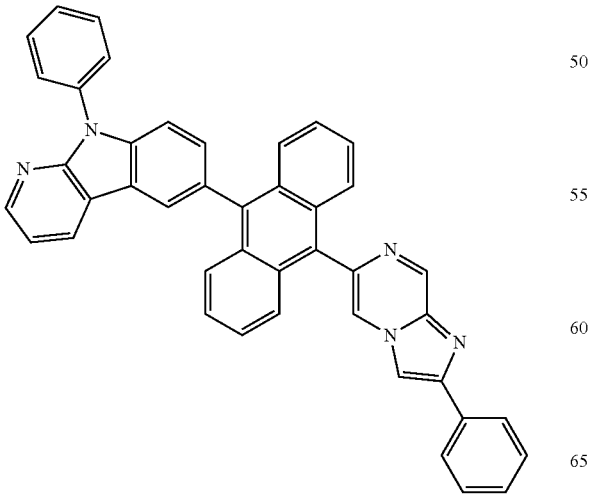
1-28
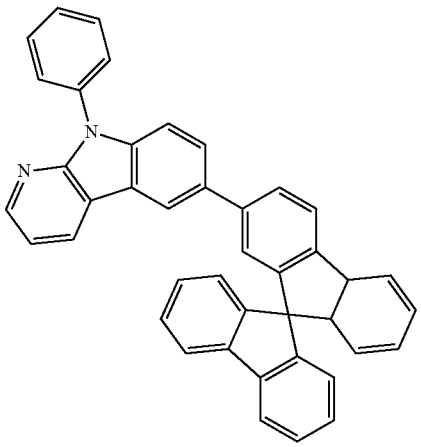
1-29
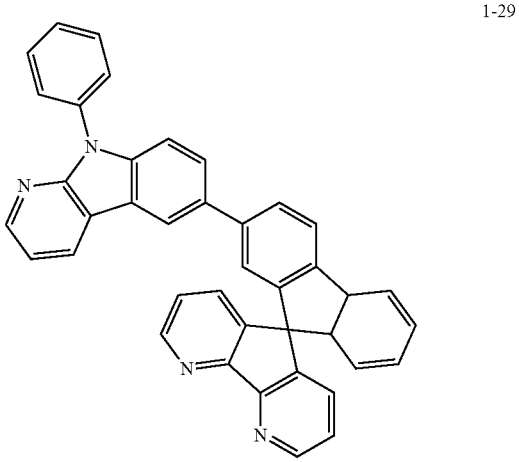 [SMILES: C1=CC2c3ccc(-c4ccc5c(c4)c4cccnc4n5-c4ccccc4)cc3C3(c4ccccc4-c4ccccc43)C2C=C1]
1-30
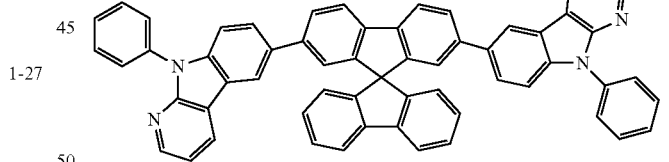
1-31
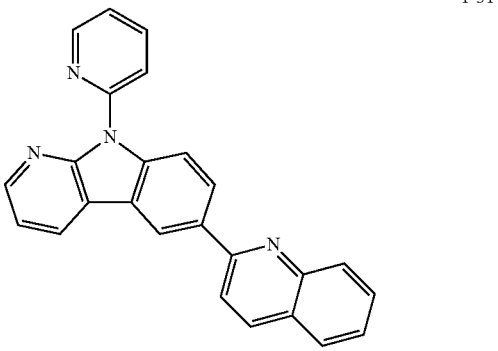

1-32
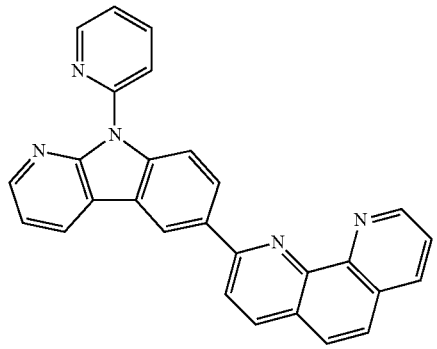
1-33
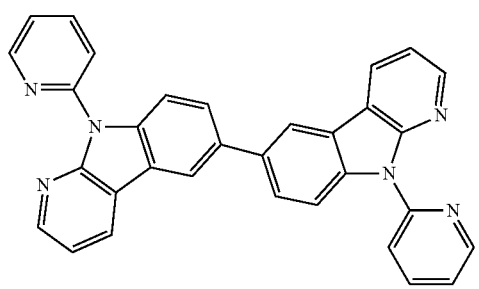
1-34
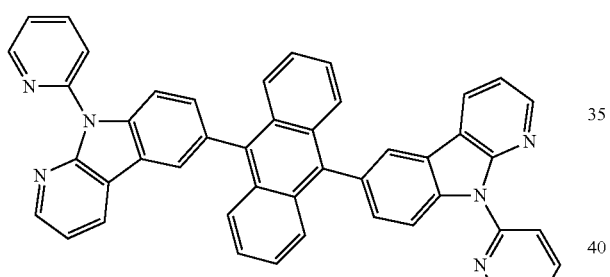
1-35
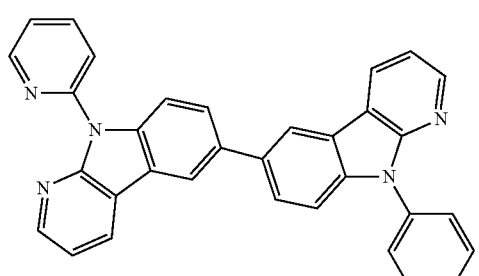
1-36
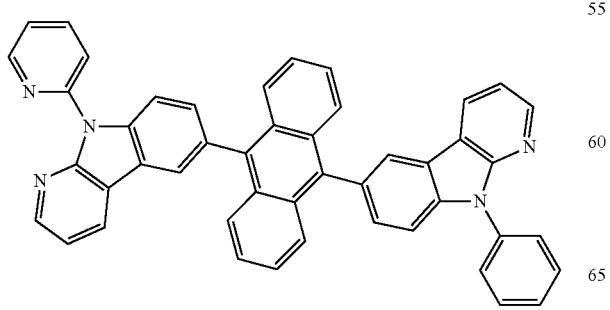
1-37
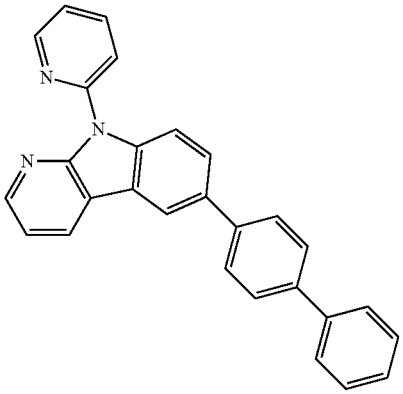
1-38
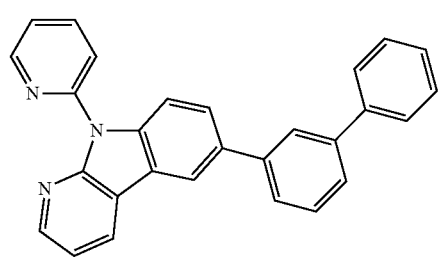
1-39
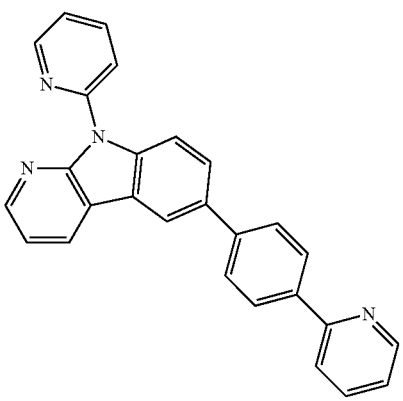
1-40
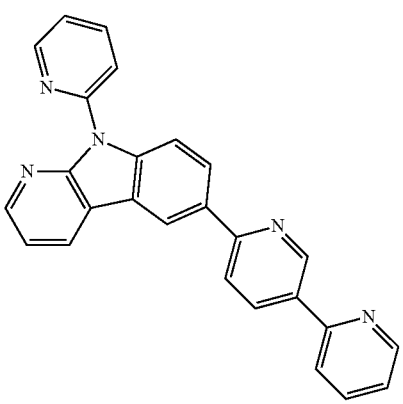

1-41
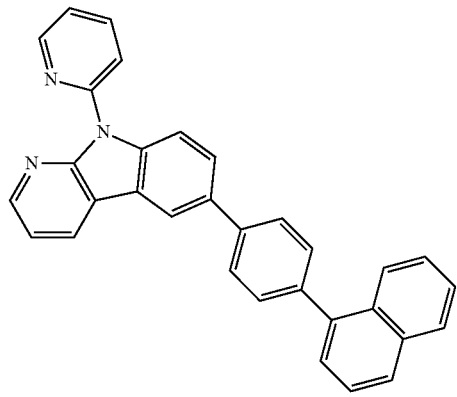
1-42
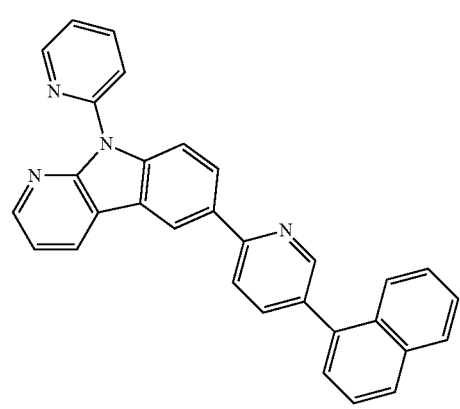
1-43
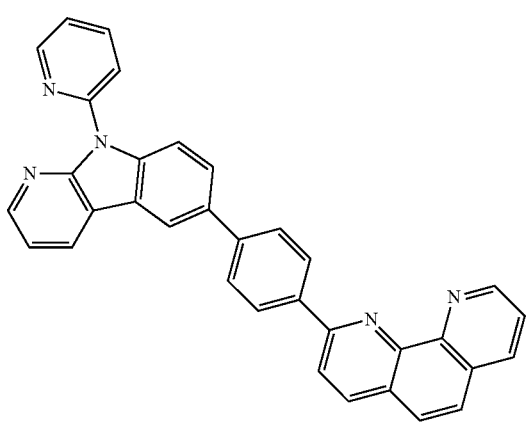
1-44
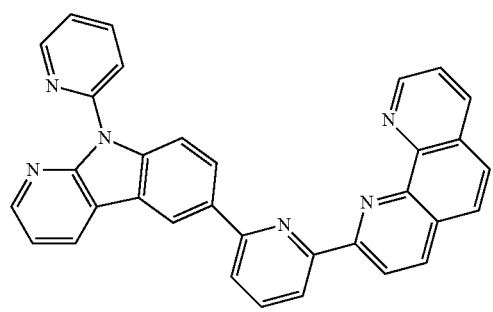
1-45
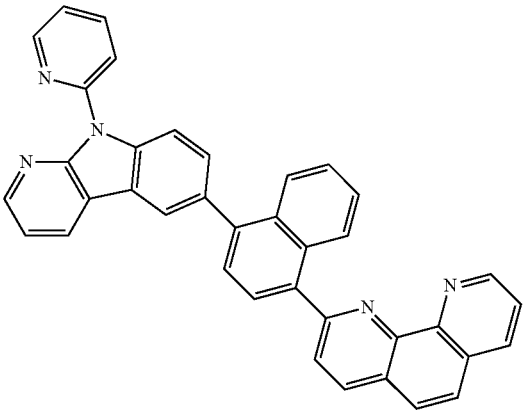
1-46
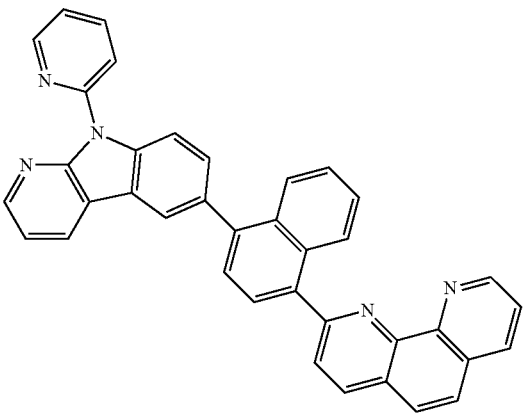
1-47
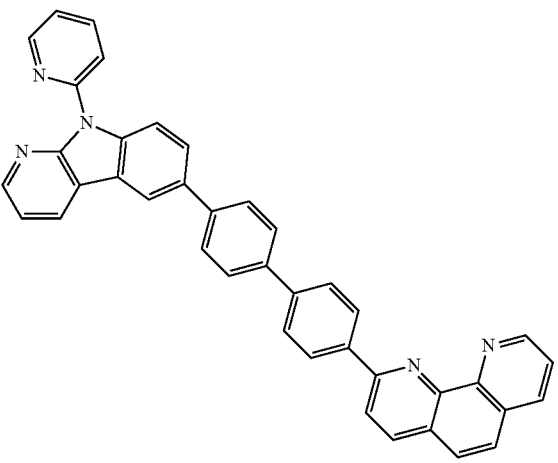

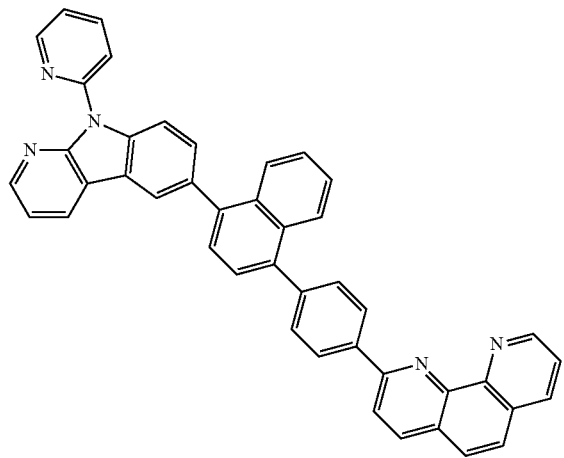
1-48
1-49
1-50
1-51
1-52
1-53
1-54
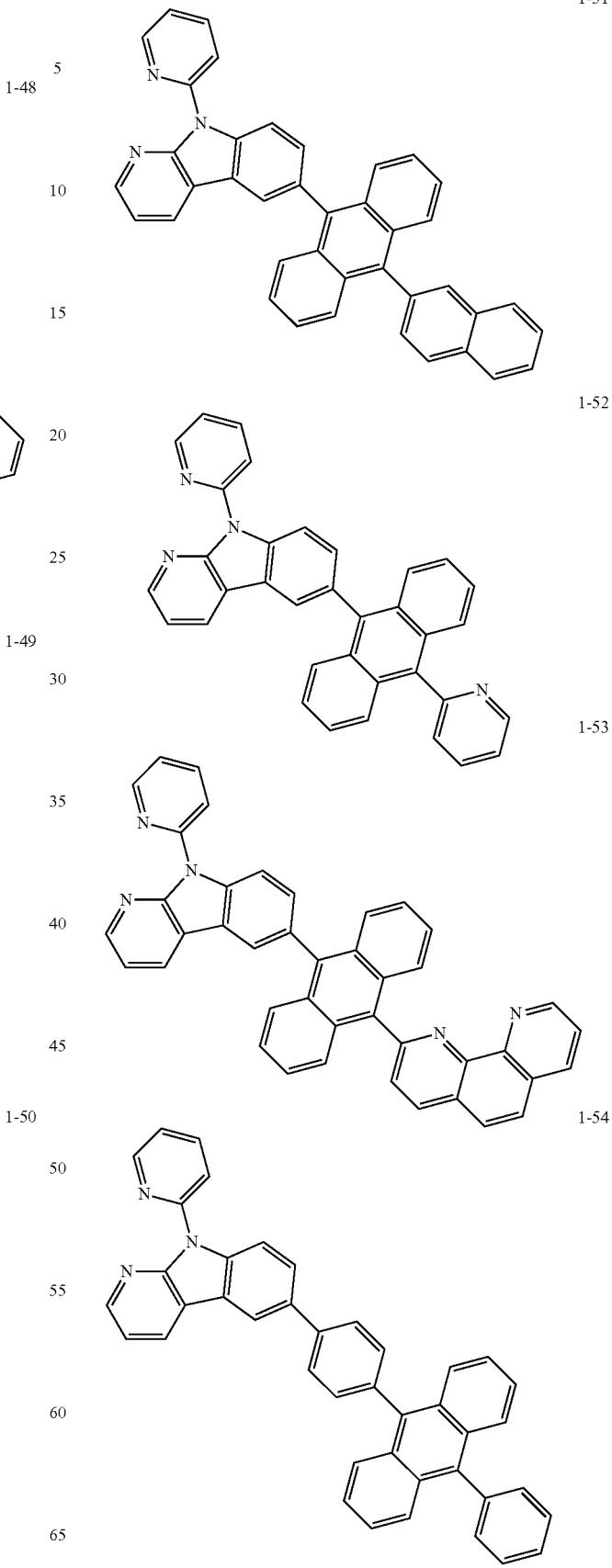

1-55
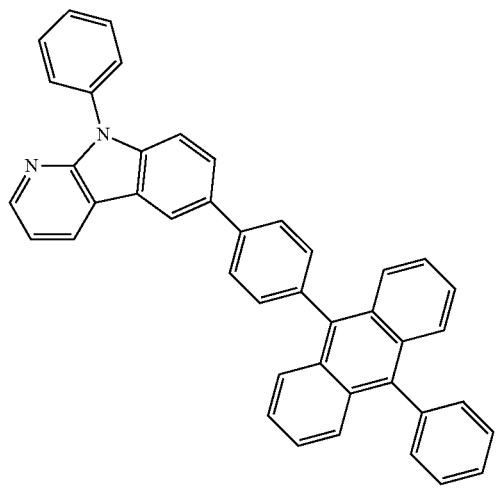
1-56
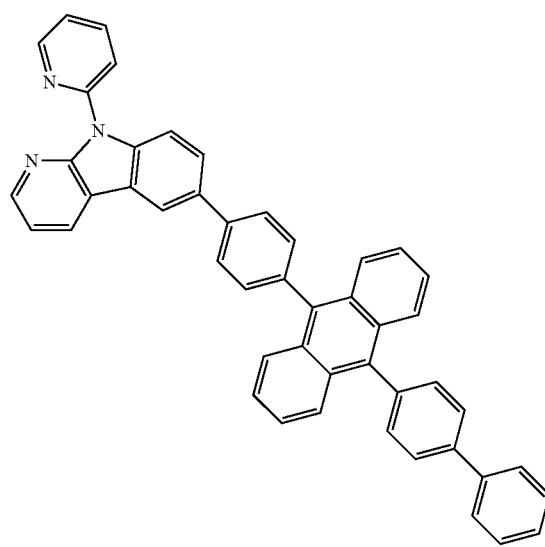
1-57
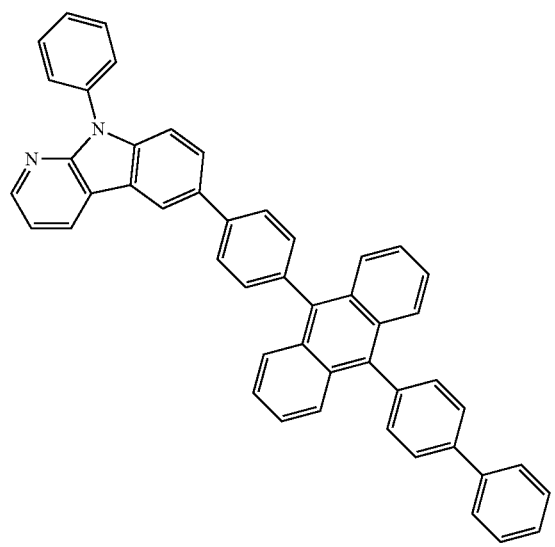
1-58
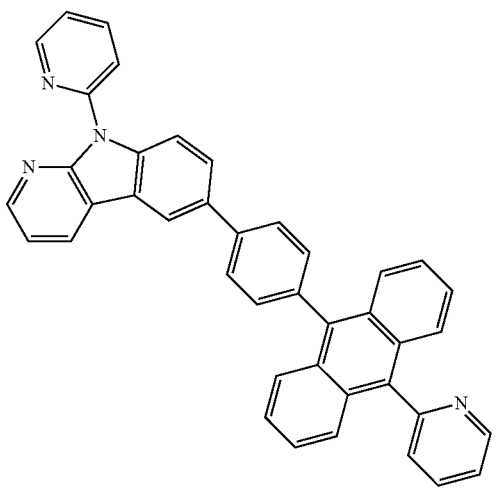
1-59
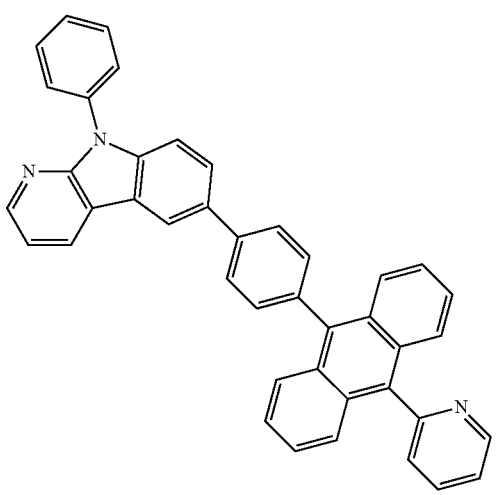
1-60
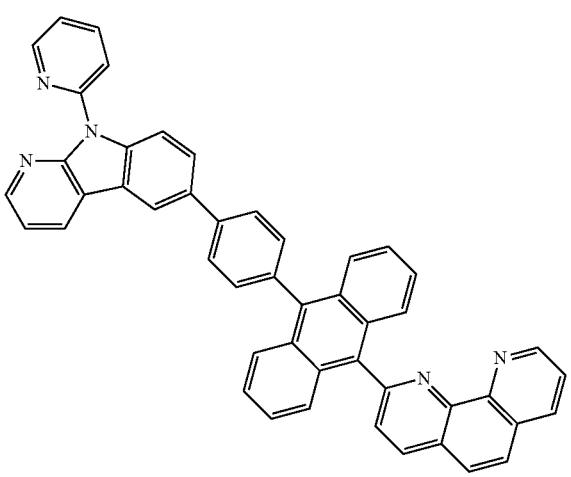

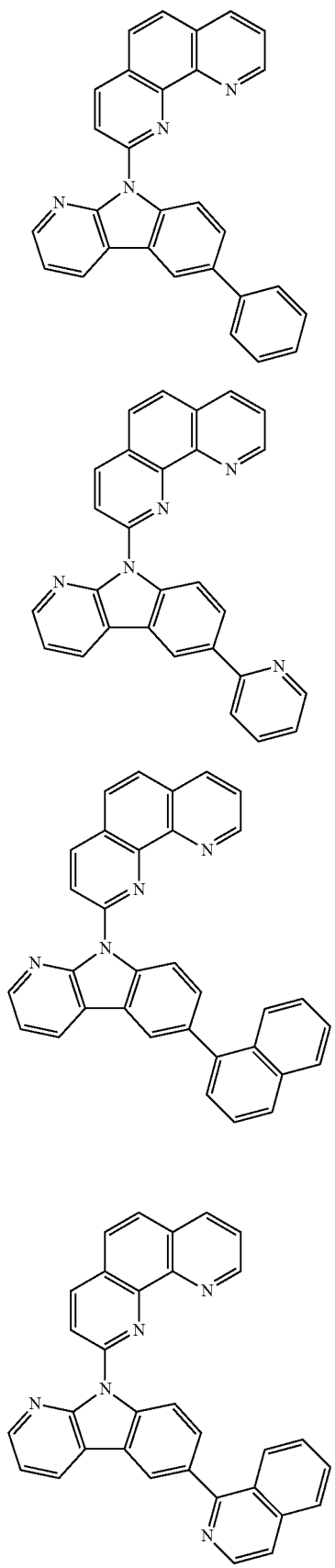
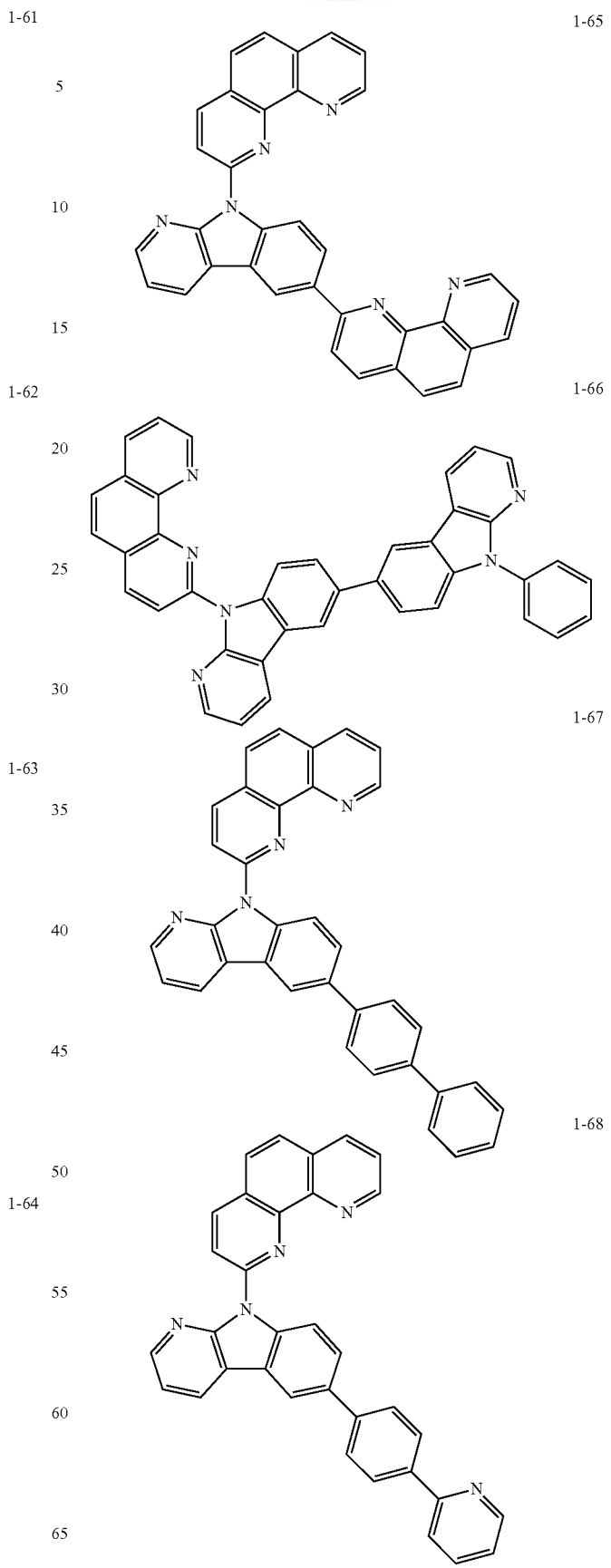

1-69
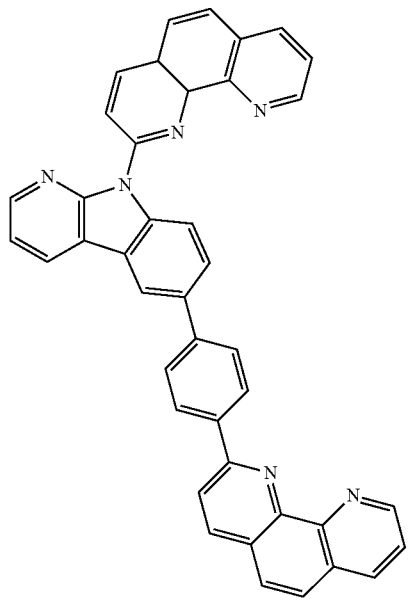
1-70
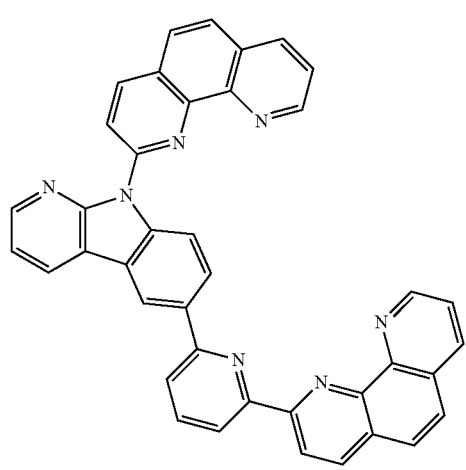
1-71
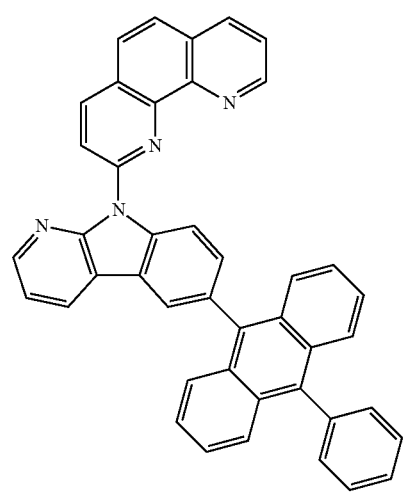
1-72
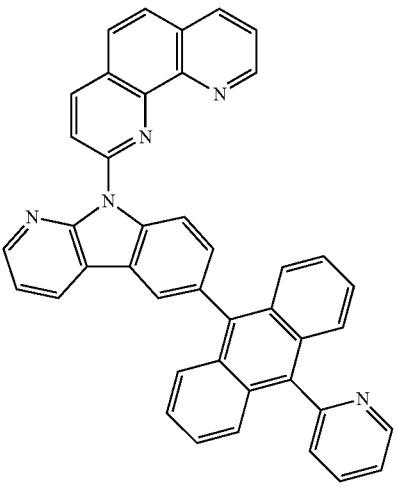
1-73
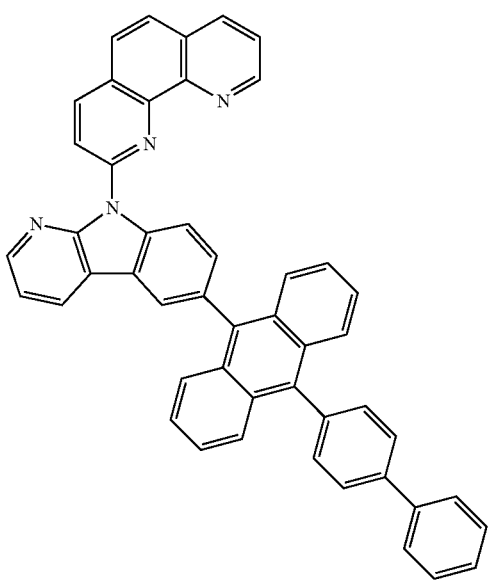
1-74
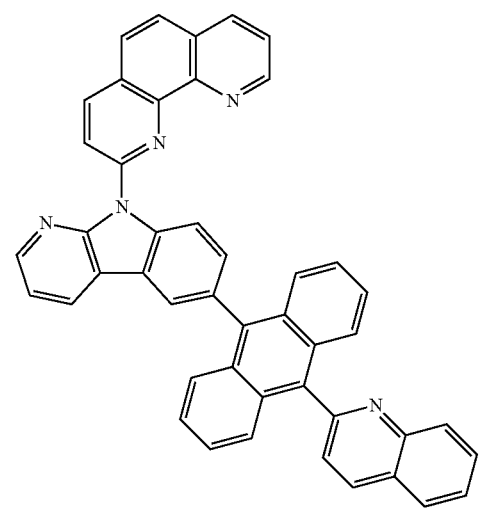

1-75
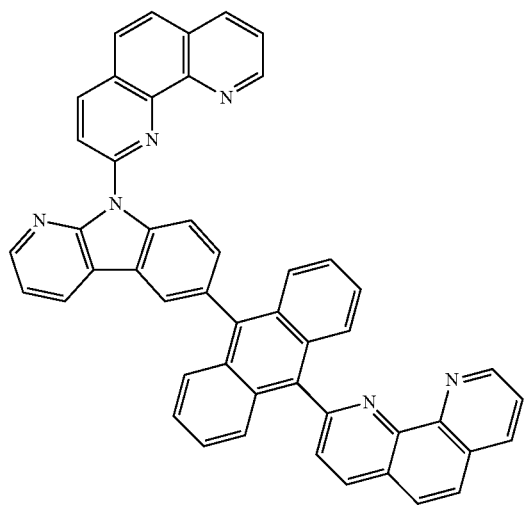
1-76
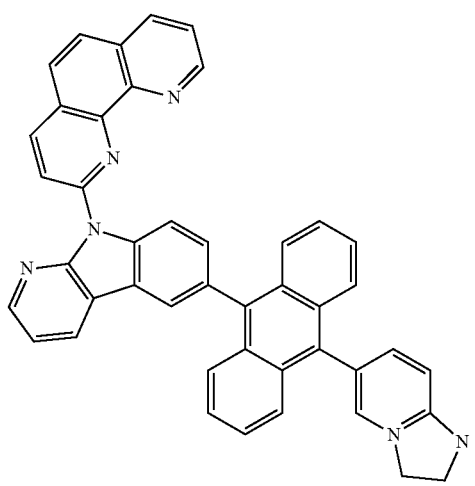
1-77
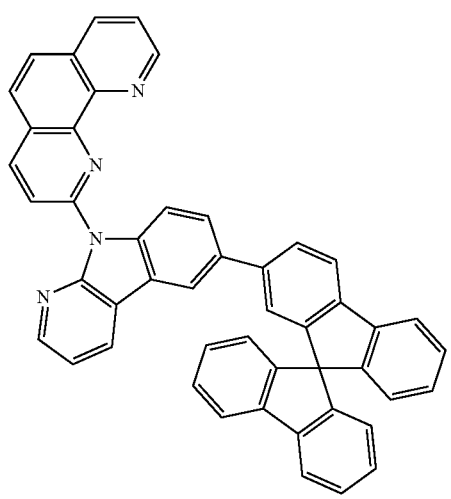
1-78
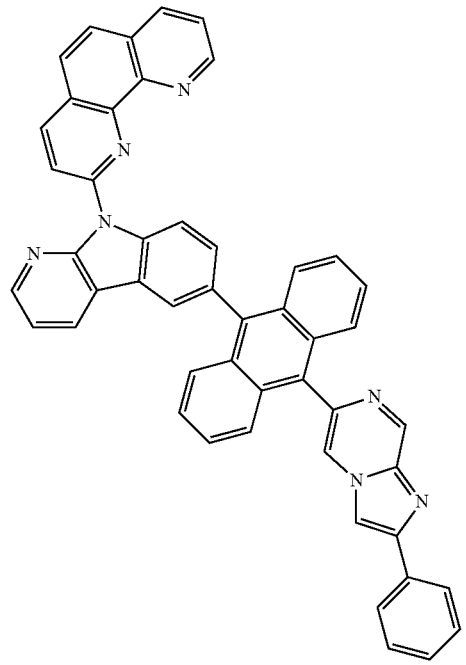
1-79
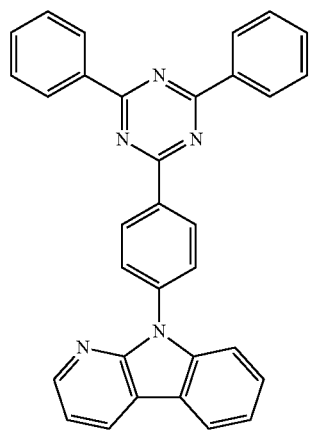
1-80
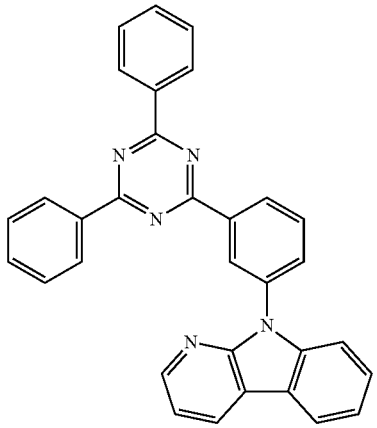

1-81
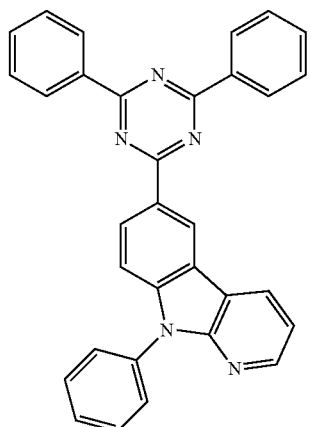
1-82
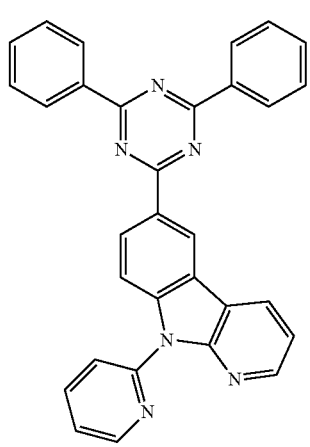
1-83
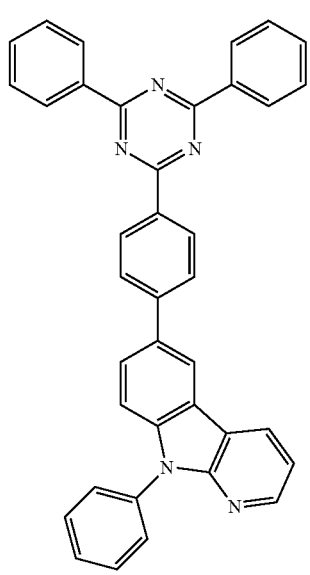
1-84
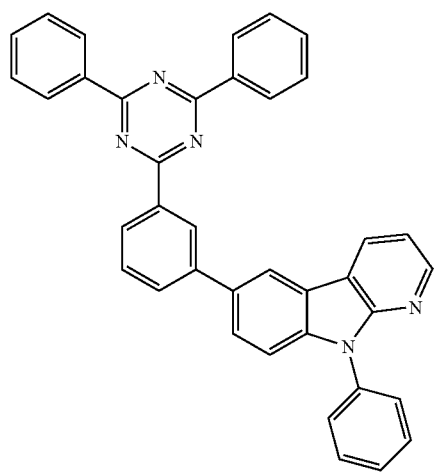
1-85
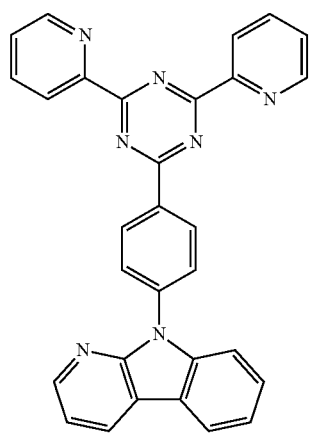
1-86
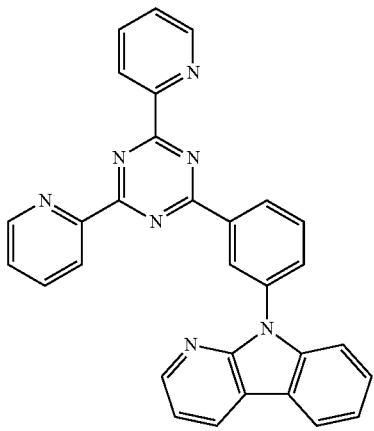

1-87
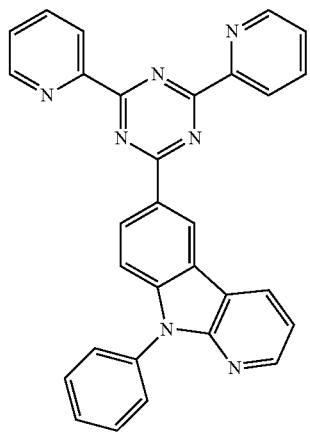
1-88
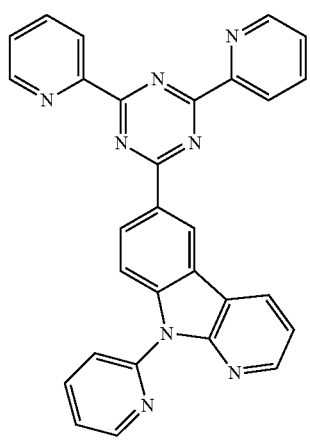
1-89
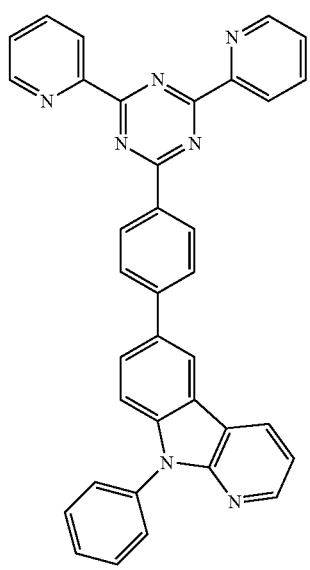
1-90
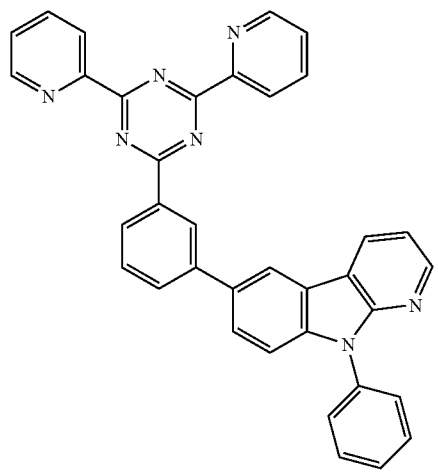
1-91
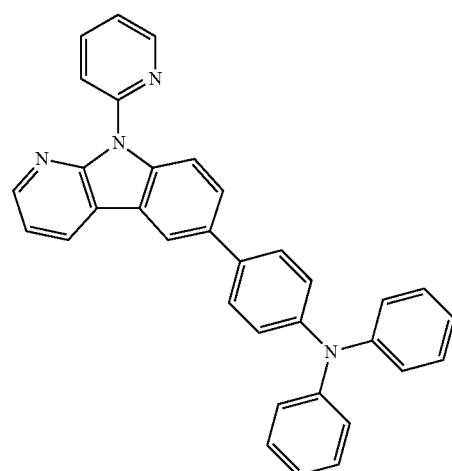
1-92
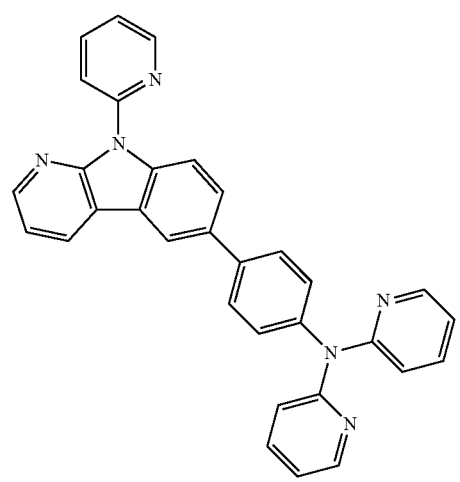

1-93
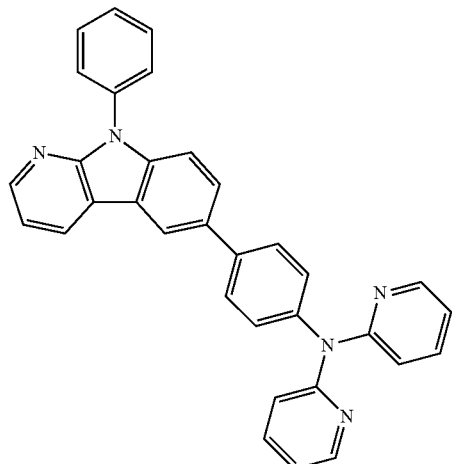
1-94
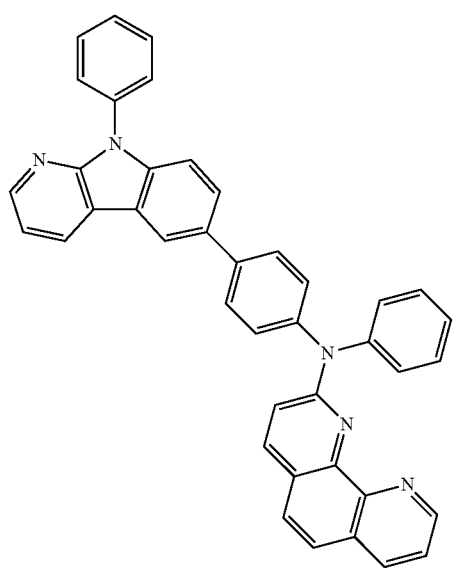
1-95
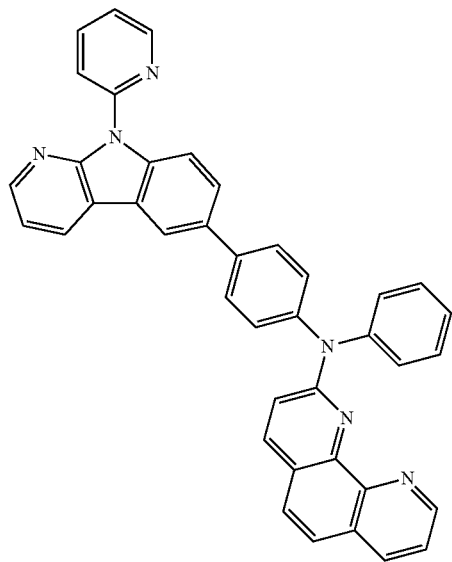
1-96
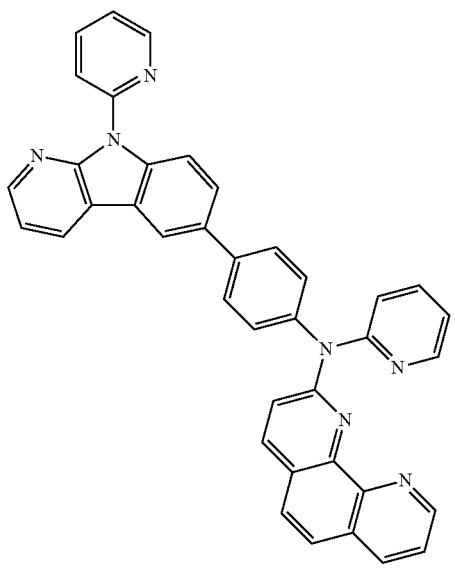
1-97
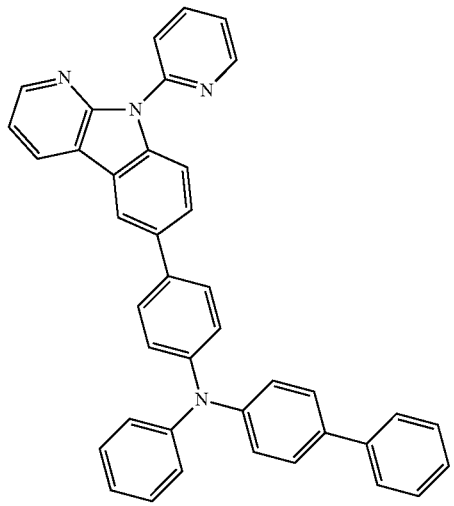
1-98
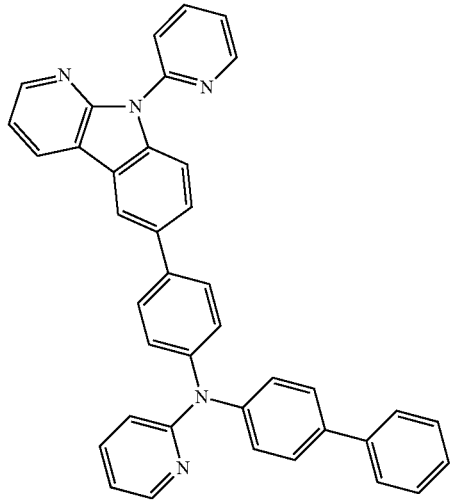

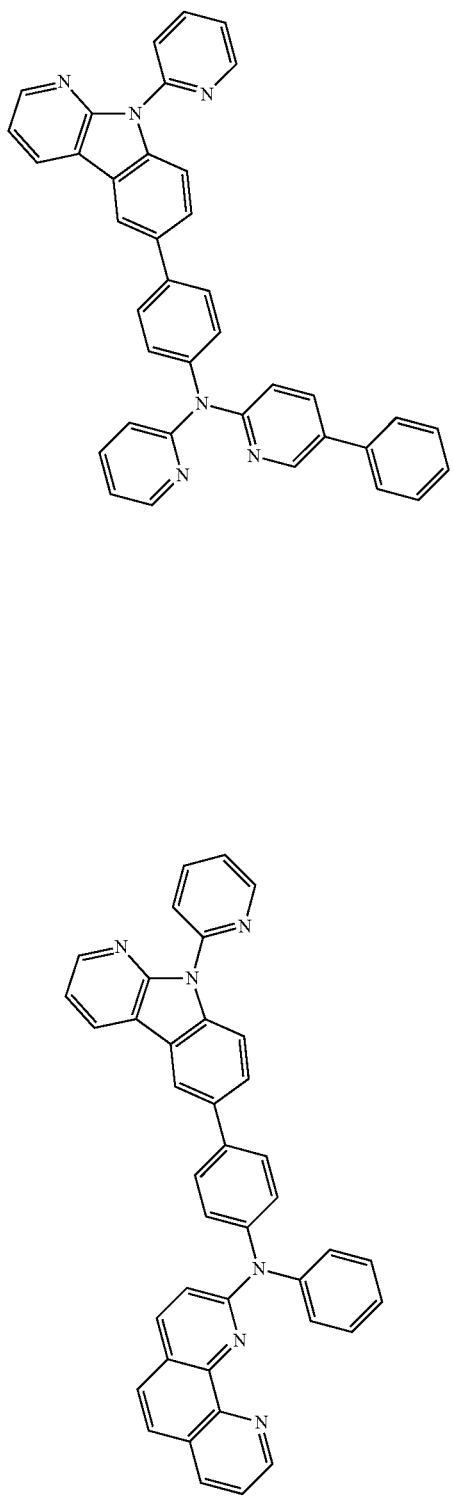

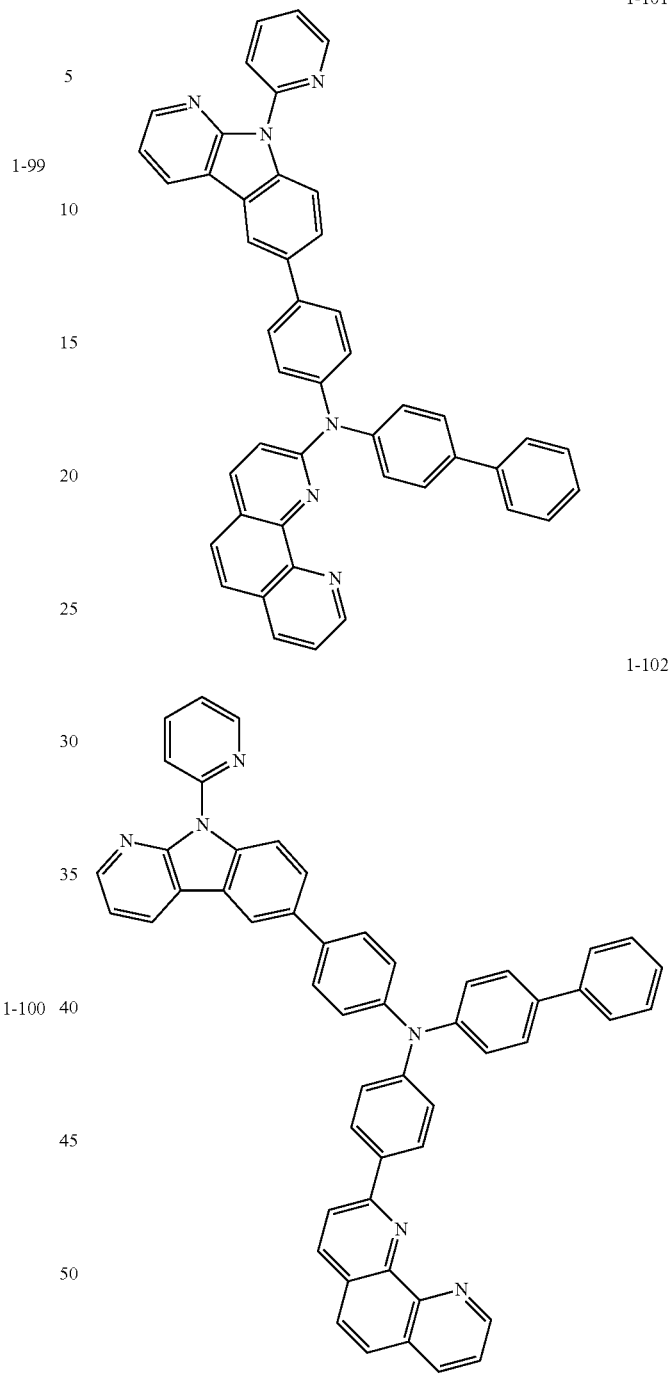

A compound according to an exemplary embodiment of the present invention has bipolarity by containing the aforementioned reactive groups, especially, reactive groups having nitrogen as one of heteroatoms. For this reason, the HOMO (Highest Occupied Molecular Orbital) and LUMO (Lowest Unoccupied Molecular Orbital) energy levels are easily adjusted, thereby lowering the driving voltage of organic light-emitting diodes. Hence, the compound according to the exemplary embodiment of the present invention serves as excellent materials for the electron transporting layer of an organic light-emitting diode or the n-type charge generation layer of a tandem organic light-emitting diode.

The compound according to the exemplary embodiment of the present invention has high thermal stability with a glass-transition temperature of 120° C. or higher and a melting temperature of 290° C. or higher. As such, a high-efficiency organic light-emitting diode can be realized.

FIG. 1 is a cross-sectional view of an organic light-emitting diode according to an exemplary embodiment of the present invention. Referring to FIG. 1, the organic light-emitting diode comprises a substrate 110, an anode 120, an organic layer 130, and a cathode 140.

The substrate 110 is a substrate for supporting and protecting various elements of an organic light-emitting display device. The substrate 110 may be formed of an insulating material, for example, but not limited to, glass or plastic, and may be formed of various materials.

The anode 120 is formed of a conductive material with a high work function because it has to supply holes. The anode 120 may comprise a transparent conductive layer with a high work function. The transparent conductive layer may be formed of a transparent conductive oxide (TCO), for example, ITO (Indium Tin Oxide), IZO (Indium zinc oxide), IZTO (indium zinc tin oxide), ZnO (Zinc Oxide), etc.

The organic layer 130 is a stack structure for emitting light, and may form a single light-emitting part structure or a multiple light-emitting part structure. The single light-emitting part structure will be explained with reference to FIG. 1, and the multiple light-emitting part structure will be described with reference to FIGS. 2 and 3.

The organic layer 130 having the single light-emitting part structure may include by stacking a hole injection layer (HIL) 131, a hole transporting layer (HTL) 132, an emissive layer 133, an electron transporting layer (ETL) 134, and an electron injection layer (EIL) 134. The hole injection layer 131 and the electron injection layer 135 may be omitted depending on the structure or characteristics of the organic light-emitting display device.

The hole injection layer 131 facilitates injection of holes from the anode 120 into the emissive layer 133. For example, the hole injection layer 131 may be formed of a material selected from among, but not limited to, PANI (polyaniline), NPD (N, n_dinaphthyl-N,N'-diphenyl benzidine), CuPc (copper phthalocyanine), PEDOT (poly(3,4)-ethylenedioxythiophene), etc.

The hole transporting layer 132 facilitates transportation of holes. For example, the hole transporting layer 132 may be formed of a material selected from among, but not limited to, NPD (N,N-dinaphthyl-N,N'-diphenyl benzidine), TPD (N,N'-bis-(3-methylphenyl)-N,N-bis-(phenyl)-benzidine), spiro-TAD92,2,7,7'-tetrakis(N,N-diphynylamino)-9,9'-spirofluorene), and MTDATA (4,4',4"-Tris(N-3-methylphenyl-N-phenyl-amino)-triphenylamine), etc.

The emissive layer 133 emits light of a specific wavelength. The emissive layer 133 comprises a host and various dopants incorporated into the host. An anthracene-based blue host and a pyrene-based dopant may be used to emit light of a blue wavelength. For example, the emissive layer 133 may be formed of a material selected from among, but not limited to, ADN (9,10-di(2-naphthyl)anthracene), CBP (4,4'-N,N'-dicarbazolbiphenyl), DPVBi (4,4'-bis(2,2-diphynylethen-1-yl)-diphenyl). The dopants may be formed of various materials to emit light at desired wavelengths. For example, the dopants may be formed of a material such as 1,6-Bis(diphynylamine)pyrene, TBPe (tetrakis(t-butyl) perylene), etc to emit light of a blue wavelength, and a material such as $Ir(piq)_2acac$ (Bis(1-phenylisoquinoline) acetylacetonate)iridium (III)) to emit light of a red wavelength, and a material such as Irppy3 (fac-tris(2-phenylpyridine)iridium) to emit light of a green wavelength.

In FIG. 1, the electron transporting layer 134 is formed on the emissive layer 133, facilitates transportation of electrons, and may include a compound represented by the above Chemical Formula 1. The compound includes a carbazole compound. When the electron transporting layer 134 contains the compound represented by Chemical Formula 1, the driving voltage of the organic light-emitting diode may be reduced, and the efficiency and lifetime of the organic light-emitting diode may be improved.

The electron injection layer 135 on the electron transporting layer 134 facilitates injection of electrons. The electron injection layer 135 may be formed of a material selected from among, but not limited to, $Alq_3$ (tris(8-hydroxyquinolino)aluminum), TAZ (3-phenyl1-4-(1-naphthyl)-5-phenyl-1,2,4-triazole), Balq (bis(2-methyl-8-quinolinate), etc. Depending on the exemplary embodiment, the electron injection layer 135 may be formed of a metal halide compound such as MgF2, LiF, NaF, KF, RbF, CsF, FrF, CaF2, etc.

The cathode 140 is formed on the emissive layer 133. The cathode 140 is formed of a high-conductivity material with a low work function. For example, the cathode 140 may be formed of a metallic material such as silver (Ag), titanium (Ti), aluminum (Al), gold (Au), molybdenum (Mo), an alloy of silver (Ag) and magnesium (Mg), etc, may be formed of ITO, IZO, etc depending on the exemplary embodiment, and the present invention is not limited to these materials.

Figure 2:
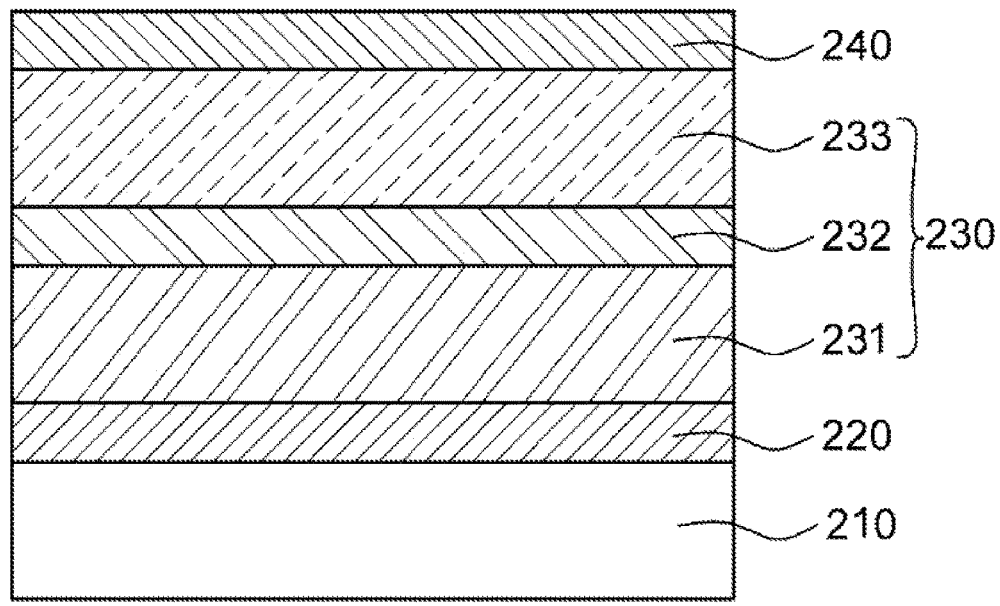
FIG. 2 is a cross-sectional view of a tandem organic light-emitting diode according to another exemplary embodiment of the present invention.

FIG. 2 is a cross-sectional view of a tandem organic light-emitting diode according to another exemplary embodiment of the present invention. Referring to FIG. 2, the organic light-emitting diode comprises a substrate 210, an anode 220, an organic layer 230, and a cathode 240. The substrate 210, anode 220, and cathode 240 of FIG. 2 are substantially identical to the substrate 110, anode 120, and cathode 140 of FIG. 1, so redundant description will be omitted.

The organic layer 230 comprises a first light-emitting part 231, a charge generation layer 232, and a second light-emitting part 233. The first light-emitting part 231 comprises a hole injection layer, a hole transporting layer, an emissive layer, and an electron transporting layer, and the second light-emitting part 233 comprises a hole transporting layer, an emissive layer, an electron transporting layer, and an electron injection layer. The first light-emitting part 231 may be configured to emit, for example, blue light, and the second light-emitting part 233 may be configured to emit green light or yellow-green light.

The electron transporting layers of the first light-emitting part 231 and second light-emitting part 233 shown in FIG. 2 may include a compound represented by the above Chemical Formula 1. The compound includes a carbazole compound. For example, the electron transporting layers may be formed of a material selected from among, but not limited to, TmPyPb (1,3,5-tri(m-pyrid-3-yl-phenyl)benzene), Alq3, TAZ, BAlq, etc. A charge generation layer 232 is on the first light-emitting part 231. The charge generation layer 232 includes an n-type charge generation layer and a p-type charge generation layer. The charge generation layer 232 generates charges or divides charges into holes and electrons to inject the charges into the first light-emitting part 231 and the second light-emitting part 233. The n-type charge generation layer supplies electrons to the emissive layer of the first light-emitting part 231 adjacent to the anode 220, and the p-type charge generation layer supplies holes to the emissive layer of the second light-emitting part 233 adjacent to the cathode 240. Accordingly, the luminous efficiency of the organic light-emitting diode having a plurality of light-emitting parts may be kept high, and its driving voltage may be reduced.

The n-type charge generation layer may be formed of a compound represented by the above Chemical Formula 1 according to an exemplary embodiment of the present invention. The compound includes a carbazole compound. As the n-type charge generation layer is formed of a compound of this disclosure, the difference in energy level between the n-type charge generation layer and the p-type charge generation layer may be minimized, therefore more electrons are injected into the first light-emitting part 231, thereby decreasing the driving voltage. Also, in the case of an n-type charge generation layer doped with an alkali metal, diffusion of the alkali metal into the p-type charge generation layer form the n-type charge generation layer is minimized, thereby improving the lifetime of the organic light-emitting diode. That is, the n-type charge generation layer comprises an alkali metal, the compound includes nitrogen atom. The n-type charge generation layer has conductive characteristics by forming a chemical bond with an alkali metal and a non-covalent electron pair of nitrogen, which is one of the heteroatoms. Therefore electrons are transported from the N-type charge generation layer to the electron transporting layer due to conductive characteristics.

And, the organic light-emitting display device, to which the organic layer including the compound is applied, is further improved than the organic light-emitting display device, to which an organic layer not including the compound is applied, in the electron injection of the anode direction or the hole injection of the cathode direction and relatively increases the emission efficiency and the lifetime.

Figure 3:
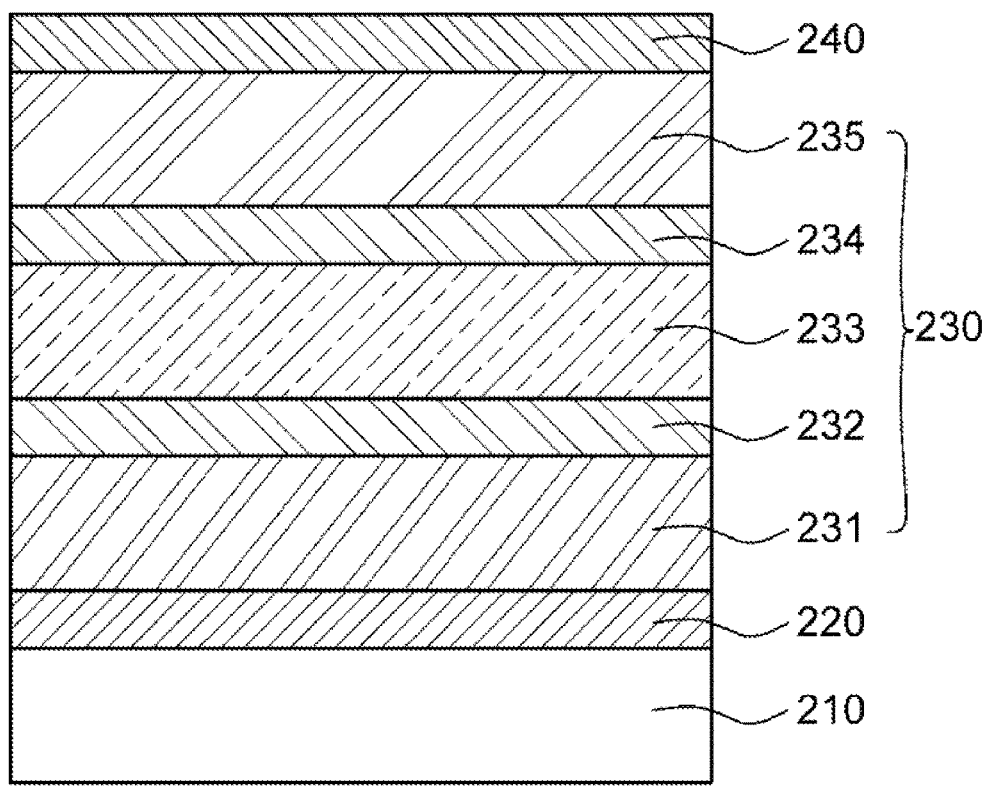
FIG. 3 is a cross-sectional view of a tandem organic light-emitting diode according to another exemplary embodiment of the present invention.

FIG. 3 is a cross-sectional view of a tandem organic light-emitting diode according to another exemplary embodiment of the present invention.

Referring to FIG. 3, the organic light-emitting diode comprises a substrate 210, an anode 220, an organic layer 230, and a cathode 240. The substrate 210, anode 220, and cathode 240 of FIG. 3 are substantially identical to the substrate 110, anode 120, and cathode 140 of FIG. 1, so redundant description will be omitted.

The organic layer 230 comprises a first light-emitting part 231, a first charge generation layer 232, a second light-emitting part 233, a second charge generation layer 234, and a third light-emitting part 235. The first light-emitting part 231, first charge generation layer 232, and second light-emitting part 233 of FIG. 3 may be substantially identical to the first light-emitting part 231, charge generation layer 232, and second light-emitting part 233 of FIG. 2. The only difference is that, in FIG. 3, the first light-emitting part 231 is configured to emit, for example, blue light, the second light-emitting part 233 is configured to emit green light or yellow-green light, and the third light-emitting part 235 is configured to emit blue light. Likewise, the second charge generation layer 234 on the second light emitting part 233 comprises an n-type charge generation layer and a p-type charge generation layer, and the n-type charge generation layer is formed of a compound represented by the above Chemical Formula 1. The compound includes a carbazole compound As the n-type charge generation layer is formed of the compound of this disclosure, the difference in energy level between the n-type charge generation layer and the p-type charge generation layer may be minimized, and therefore more electrons are injected into the first light-emitting part 231, thereby decreasing the driving voltage. Also, in the case of an n-type charge generation layer doped with an alkali metal, diffusion of the alkali metal into the p-type charge generation layer from the n-type charge generation layer is minimized, thereby improving the lifetime of the organic light-emitting diode.

And, the organic light-emitting display device, to which the organic layer including the compound is applied, is further improved than the organic light-emitting display device, to which an organic layer not including the compound is applied, in the electron injection of the anode direction or the hole injection of the cathode direction and relatively increases the emission efficiency and the lifetime.

Hereinafter, preparation examples of the compounds 1-51, 1-49, and 1-4 and fabrication examples of organic light-emitting diodes according to Embodiments 1, 2, and 3 and comparative Example will be described. However, the preparation and fabrication examples to be described below are only for illustrating and explaining the present invention in detail, and the present invention should not be construed as being limited thereto.

Preparation Example of Compound 1-51

6-(10-(naphthalen-3-yl)anthracen-9-yl)-9-(pyridin-2-yl)-9H-pyrido[2,3-b]indole represented by the compound 1-51 was prepared by the following reactions.

(1) Synthesis of Intermediate A (6-bromo-9-(pyridin-2-yl)-9H-pyrido[2,3-b]indole)

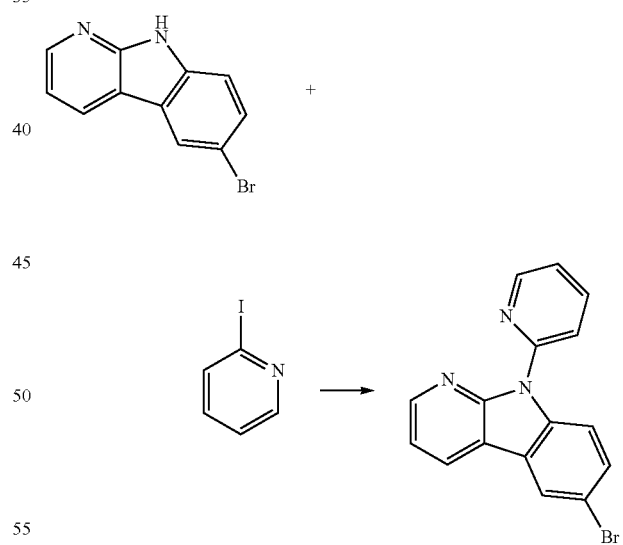

6-bromo-9H-pyrido[2,3-b]indole (10 g, 40 mmol), 2-Iodopyridine (12.4 g, 61 mmol), CuI (9.2 g, 49 mmol), trans-1,2-dicyclohexanediamine (1.8 g, 1 6 mmol), $K_3PO_4$ (34.4 g, 162 mmol) were dissolved in 1,4-dioxane in a round-bottom flask, and then stirred under reflux for 12 hours. After completion of the reaction, the mixture was distilled under reduced pressure to remove the solvent. After removal of the solvent, the residue was separated by column chromatography (hexane:MC=3:1) and precipitated with MC/Pet.ether to obtain 6 g (yield: 45.7%) of intermediate A.

(2) Synthesis of Compound 1-51 (6-(10-(naphthalen-3-yl)anthracen-9-yl)-9-(pyridin-2-yl)-9H-pyrido[2,3-b]indole)

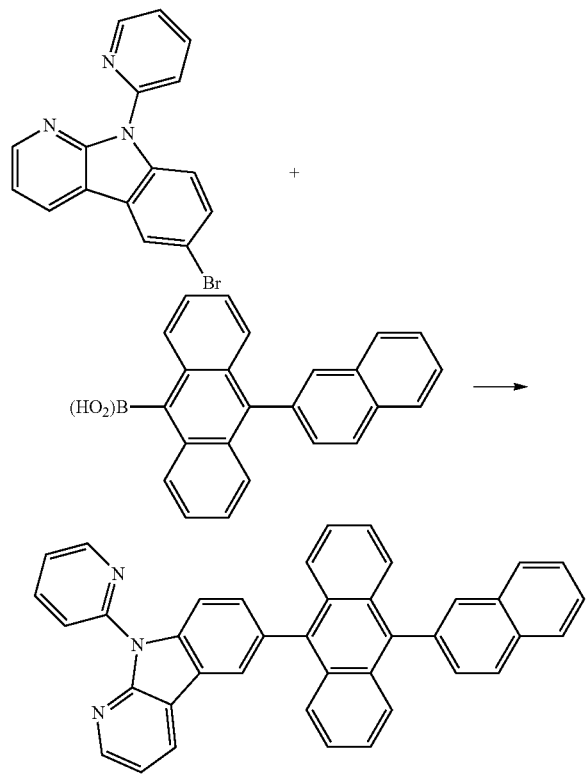

Intermediate A (3 g, 9 mmol), 9-(naphthalen-2-yl)anthracen-10-boronic acid (3.5 g, 10 mmol), Tetrakis(triphenylphosphine) palladium(0) (0.4 g, 0.4 mmol), Toluene (60 ml), EtOH (15 ml), and 2M $K_2CO_3$ (10 ml) were put into a round bottom flask under a nitrogen atmosphere and stirred under reflux for 12 hours. After completion of the reaction, the mixture was filtered to obtain a crude precipitate. The crude precipitate was separated by column chromatography using MC, followed by removal of the solvent, and then recrystallized to obtain 3 g of the compound 1-51 (yield: 59%).

2. Preparation Example of Compound 1-49

6-(10-phenylanthracen-9-yl)-9-(pyridin-2-yl)-9H-pyrido[2,3-b]indole represented by the compound 1-49 was prepared by the following reaction.

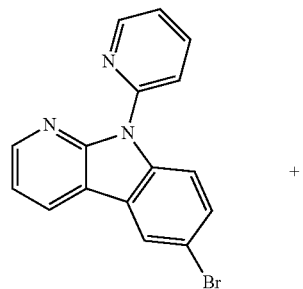

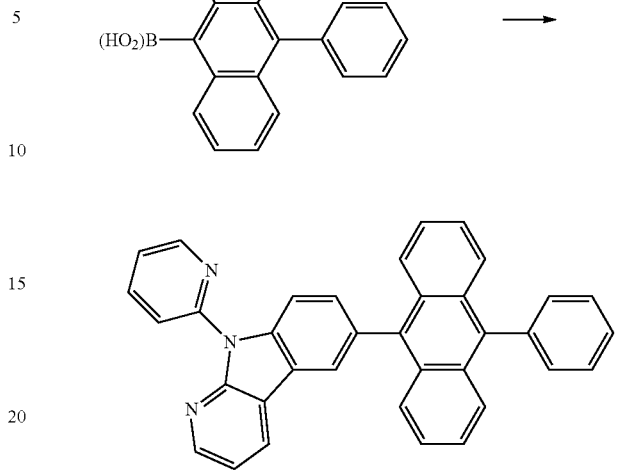

Intermediate A (3 g, 9 mmol), 9-phenylanthracen-10-boronic acid (3 g, 10 mmol), Tetrakis(triphenylphosphine) palladium(0) (0.4 g, 0.4 mmol), Toluene (60 ml), EtOH (15 ml), and 2M $K_2CO_3$ (10 ml) were put into a round bottom flask under a nitrogen atmosphere and stirred under reflux for 12 hours. After completion of the reaction, the mixture was filtered to obtain a crude precipitate. The crude precipitate was separated by column chromatography using MC, followed by removal of the solvent, and then recrystallized to obtain 2.5 g of the compound 1-49 (yield: 54%).

3. Preparation Example of Compound 1-4

1-(9-phenyl-9H-pyrido[2,3-b]indol-6-yl)ethanone represented by the compound 1-4 was prepared by the following reactions.

(1) Synthesis of Intermediate B (1-(9H-pyrido[2,3-b]indol-6-yl)ethanone)

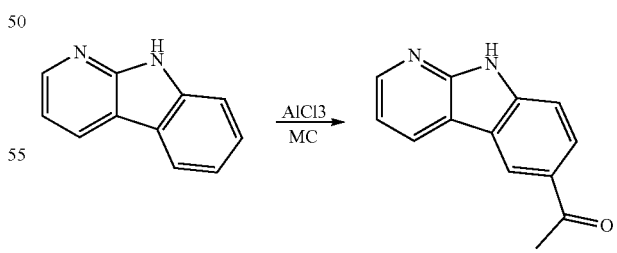

α-carboline (10 g, 59 mmol) and $AlCl_3$ (15.9 g, 119 mol) were dissolved in MC in a round-bottom flask, and then stirred under reflux for 6 hours. After completion of the reaction, the mixture was distilled under reduced pressure to remove the solvent. After removal of the solvent, the residue was separated by column chromatography (hexane:MC=3:1) to obtain 8 g (yield: 64%) of intermediate B.

(2) Synthesis of Intermediate C (1-(9-phenyl-9H-pyrido[2,3-b]indol-6-yl)ethanone)

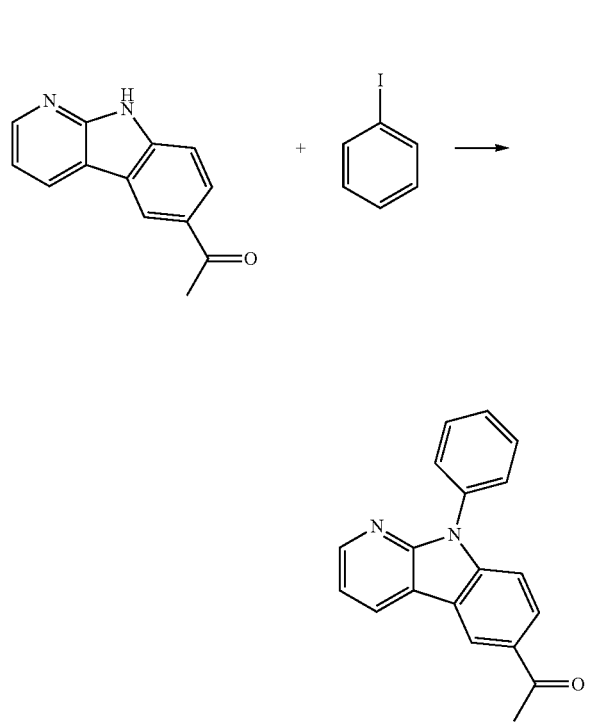

Intermediate B (5 g, 24 mmol), Iodobenzene (7.3 g, 36 mmol), CuI (5.4 g, 29 mmol), trans-1,2-dicyclohexanediamine (1.1 g, 10 mmol), K$_3$PO$_4$ (20.2 g, 95 mmol) were dissolved in 1,4-dioxane in a round-bottom flask, and then stirred under reflux for 12 hours. After completion of the reaction, the mixture was distilled under reduced pressure to remove the solvent. After removal of the solvent, the residue was separated by column chromatography (hexane:MC=3:1) and precipitated with MC/pet.ether to obtain 3 g (yield: 44%) of intermediate C.

(3) Synthesis of Compound 1-4 (1-(9-phenyl-9H-pyrido[2,3-b]indol-6-yl)ethanone)

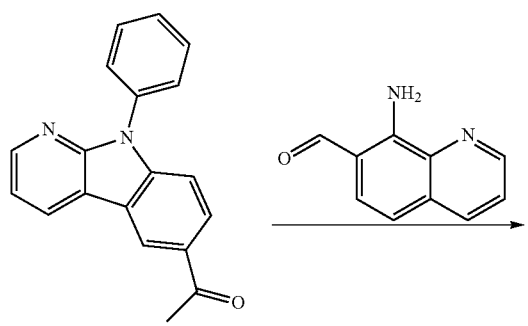

-continued

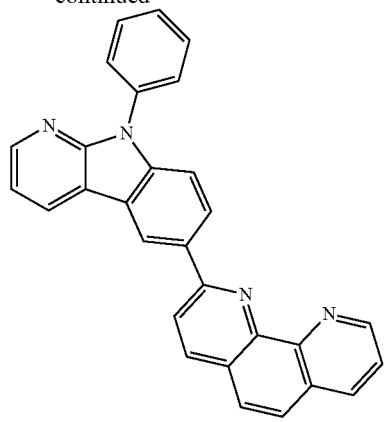

Intermediate C (3 g, 12 mmol), 8-aminoquinoline-7-carbaldehyde (5 g, 24 mmol), and KOH (10.3 g, 49 mmol) were dissolved in toluene and EtOH in a round-bottom flask, and then stirred under reflux for 12 hours. After completion of the reaction, the reaction solution was cooled and filtered through silica gel, and then the filtrate was concentrated under reduced pressure to remove the solvent. The concentrated was separated by column chromatography (MC→MC:MeOH=50:1), concentrated under reduced pressure, and washed with MeOH to obtain 2 g of the compound 1-4 (yield: 33%).

4. Fabrication Example of Embodiment 1

ITO (Indium tin oxide) was deposited with 1000 Å thickness on a substrate. HAT-CN as a hole injection layer was deposited with 50 Å thickness, and NPD as a hole transporting layer was deposited with 1200 Å thickness on the hole injection layer. Next, an emissive layer was formed on the hole transporting layer. The emissive layer was deposited with 200 Å thickness by using AND as a host and an anthracene-based compound as a dopant. Then, TmPyPb as an electron transporting layer was deposited with 100 Å thickness. The compound 1-51 as an n-type charge generation layer was deposited with 100 Å thickness. HAT-CN as a p-type charge generation layer was deposited with 200 Å thickness, then NPD as a hole transporting layer was deposited at 1200 Å thickness, and then a second emissive layer was formed with 200 Å thickness by using CBP as a host and an Ir-based material as a dopant. An electron transporting layer and an electron injection layer over the second emissive layer were formed using Alq$_3$ and LiF, respectively, and Al as a cathode was deposited with 2000 Å thickness.

5. Fabrication Example of Embodiment 2

An organic light-emitting diode was fabricated under the same condition except that the n-type charge generation layer was formed of the compound 1-49.

6. Fabrication Example of Embodiment 3

An organic light-emitting diode was fabricated under the same condition except that the n-type charge generation layer was formed of the compound 1-49.

7. Fabrication Example of Comparative Example 3

An organic light-emitting diode was fabricated under the same condition except that the n-type charge generation layer was formed of BPhen (4,7-diphenyl-1,10-phenanthroline).

The driving voltage, color coordinates, and lifetime of the organic light-emitting diodes according to the Embodiments 1, 2, and 3 and the Comparative Example 1 were measured and shown in the following Table 1. Also, the current density versus driving voltage was measured and shown in FIG. 4, and the change in luminance over time was measured and shown in FIG. 5.

Figure 4:
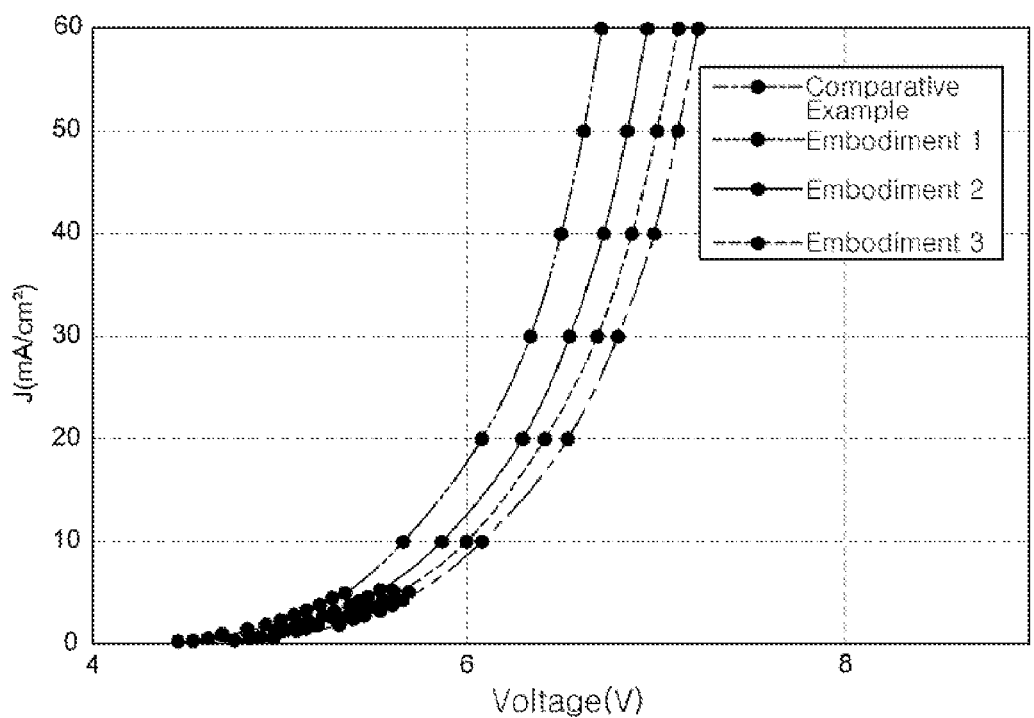
FIG. 4 is a graph explaining a decrease in the driving voltage of organic light-emitting diodes according to various exemplary embodiments of the present invention.
Figure 5:
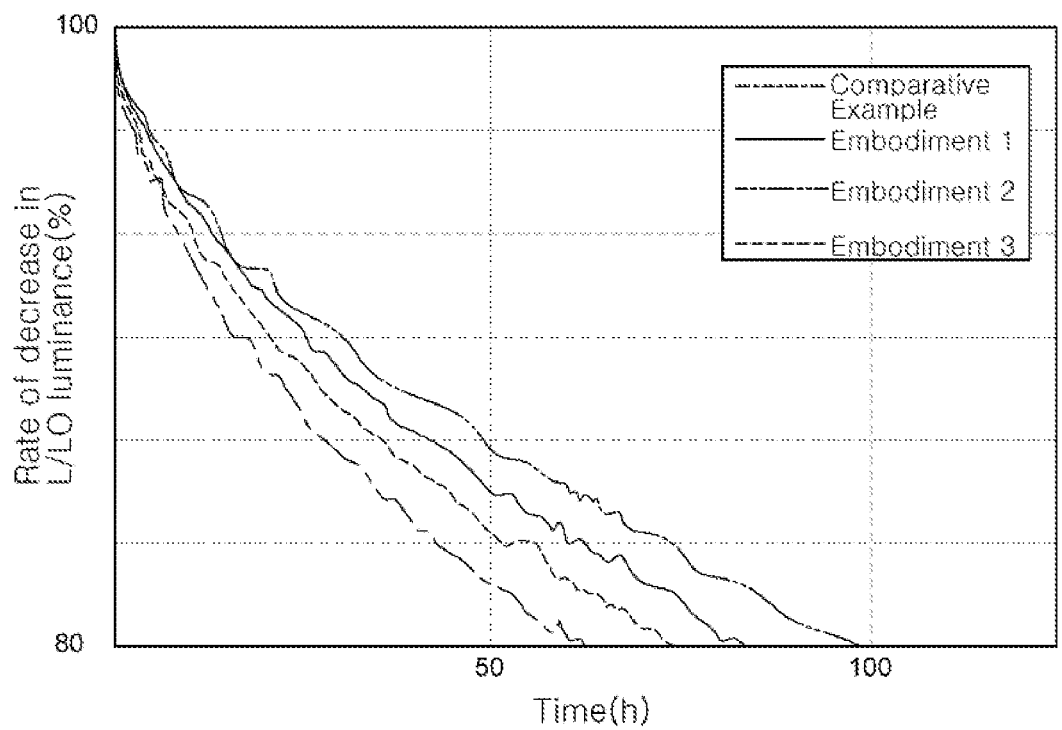
FIG. 5 is a graph explaining an increase in the lifetime of organic light-emitting diodes according to various exemplary embodiments of the present invention.

Referring to FIG. 4, it can be seen that the current density versus driving voltage according to Embodiments 1, 2, and 3 was improved compared to Comparative Example 1. Also, referring to FIG. 5, it can be seen that the change in luminance over time according to Embodiments 1, 2, and 3 was significantly improved compared to Comparative Example 1. In Table 1, the decreases in driving voltage were expressed in percentage.

TABLE 1

|  | Driving voltage(%) | CIEx | CIEy | Lifetime (T95, %) |
|---|---|---|---|---|
| Comparative Example 1 | 100 | 0.276 | 0.313 | 100 |
| Embodiment 1 | 107 | 0.275 | 0.312 | 125 |
| Embodiment 2 | 107 | 0.279 | 0.314 | 156 |
| Embodiment 3 | 105 | 0.279 | 0.316 | 110 |

As shown in Table 1, the organic light-emitting diodes according to Embodiments 1 to 3 showed substantially the same color coordinates (CIEx, CIEy) as Comparative Example 1, an increase of 5 to 7% in current density, and an increase of 10 to 56% in lifetime characteristics.

Hereinafter, the glass-transition temperature and melting temperature of the compounds prepared according to Preparation Examples 1, 2, and 3 were measured and shown in FIGS. 6A to 6C and the following Table 2.

TABLE 2

| Material Name | Tg (° C.) | Tm (° C.) |
|---|---|---|
| Embodiment 1 | 163 | 352 |
| Embodiment 2 | 145 | 332 |
| Embodiment 3 | 124 | 289 |

Figure 6A:
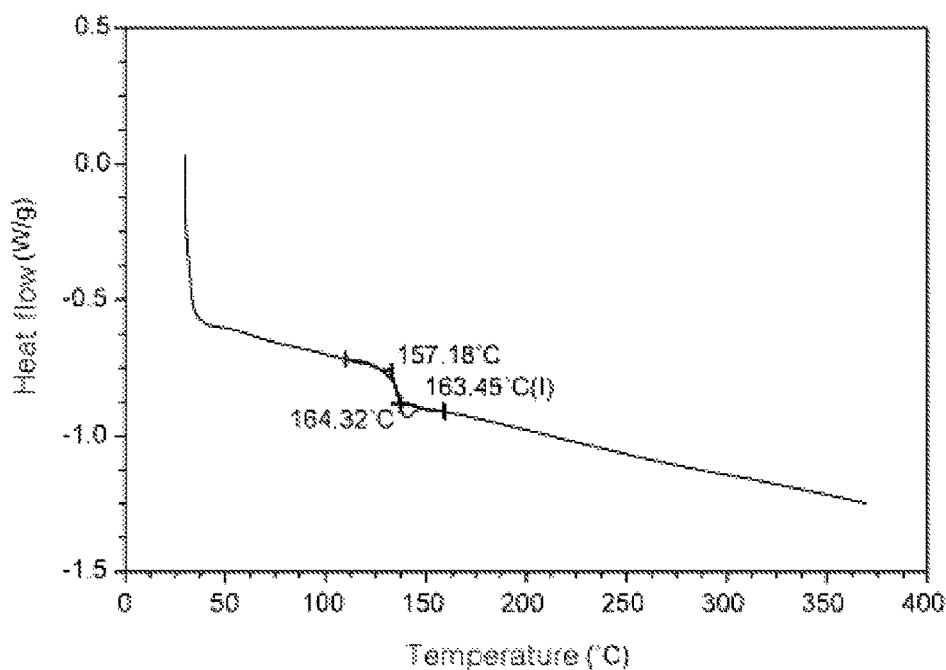
FIGS. 6A to 6C are graphs explaining the glass-transition temperature and melting temperature of organic light-emitting diodes according to various exemplary embodiments of the present invention.
Figure 6A:
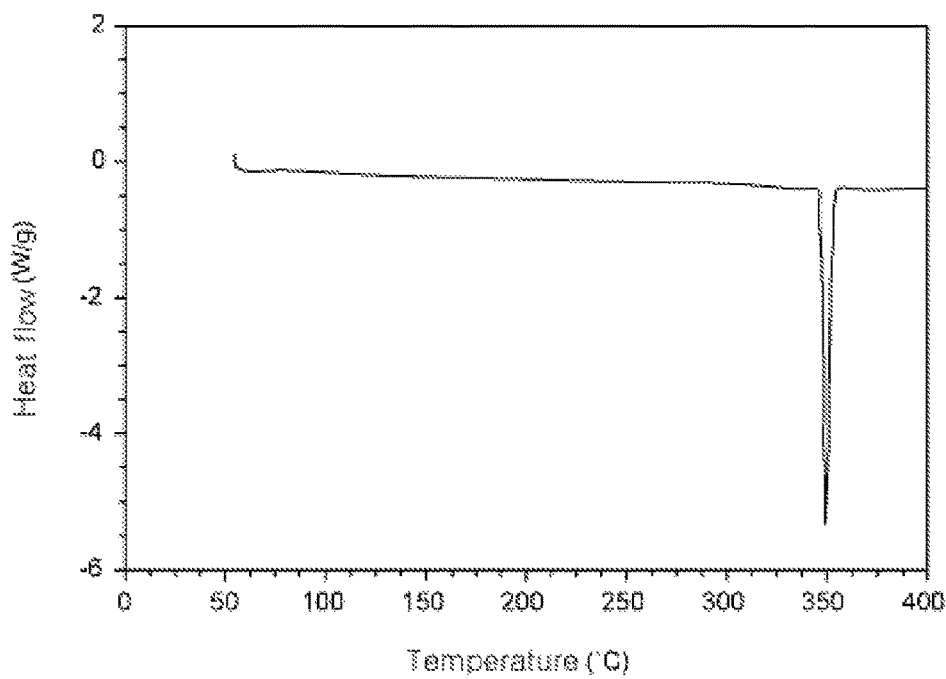
Figure 6B:
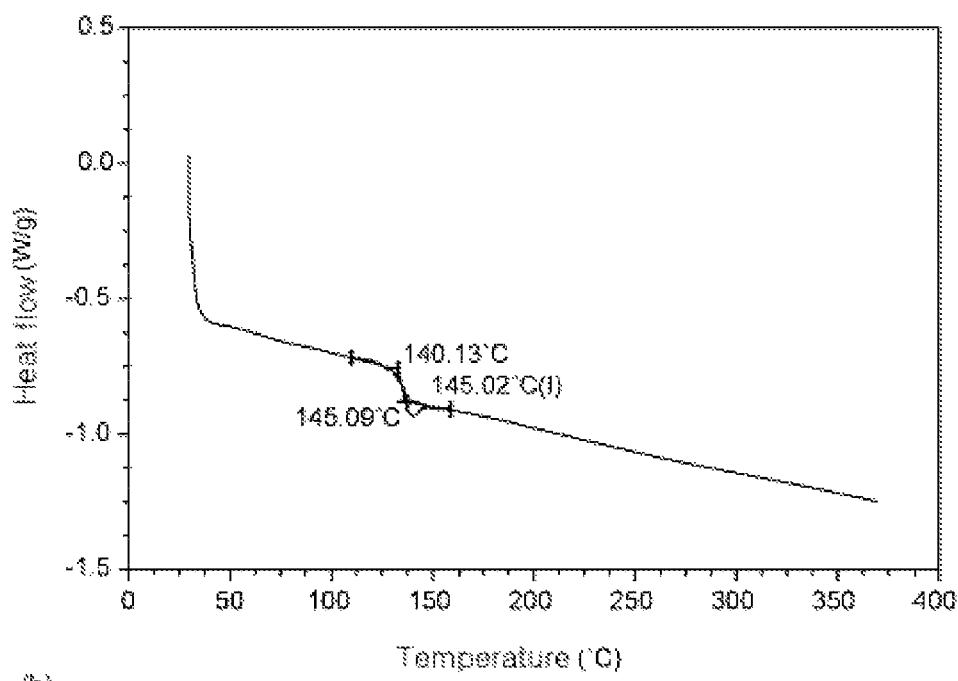
Figure 6B:
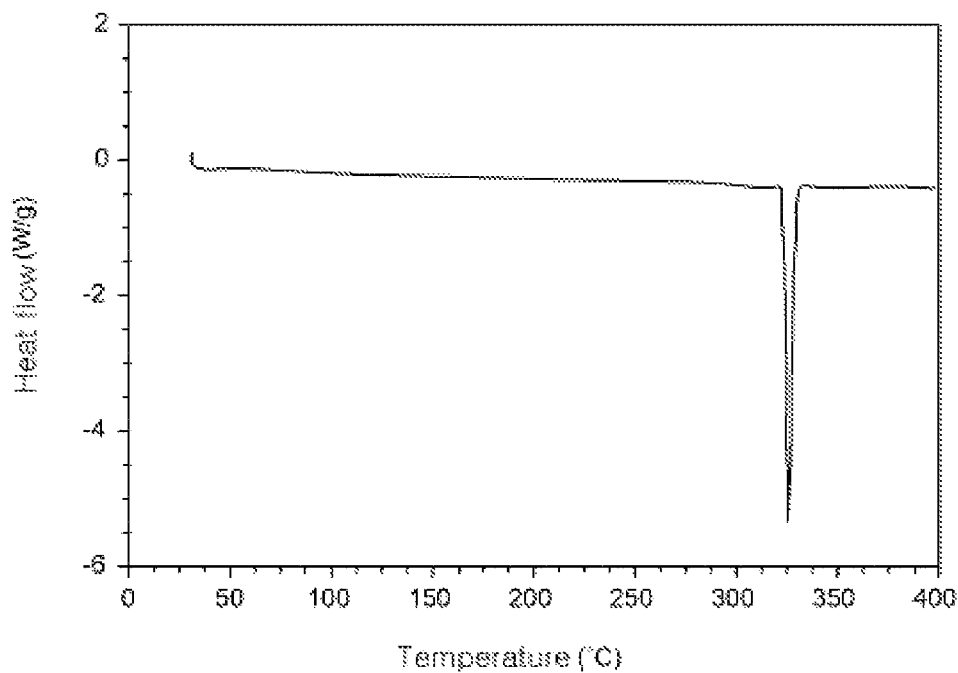
Figure 6C:
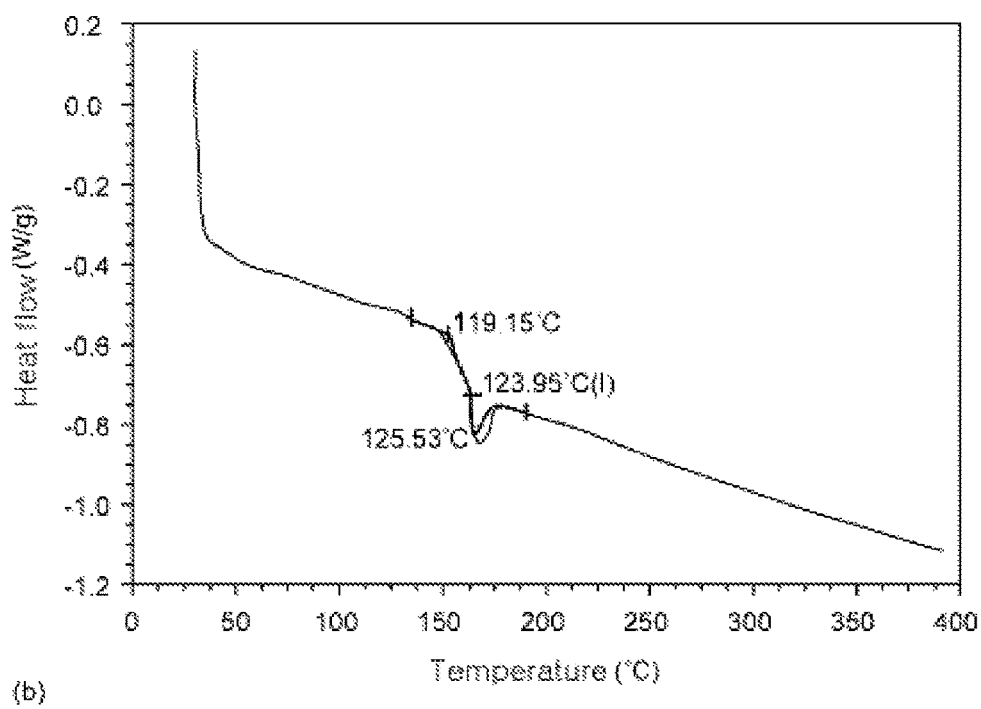
Figure 6C:
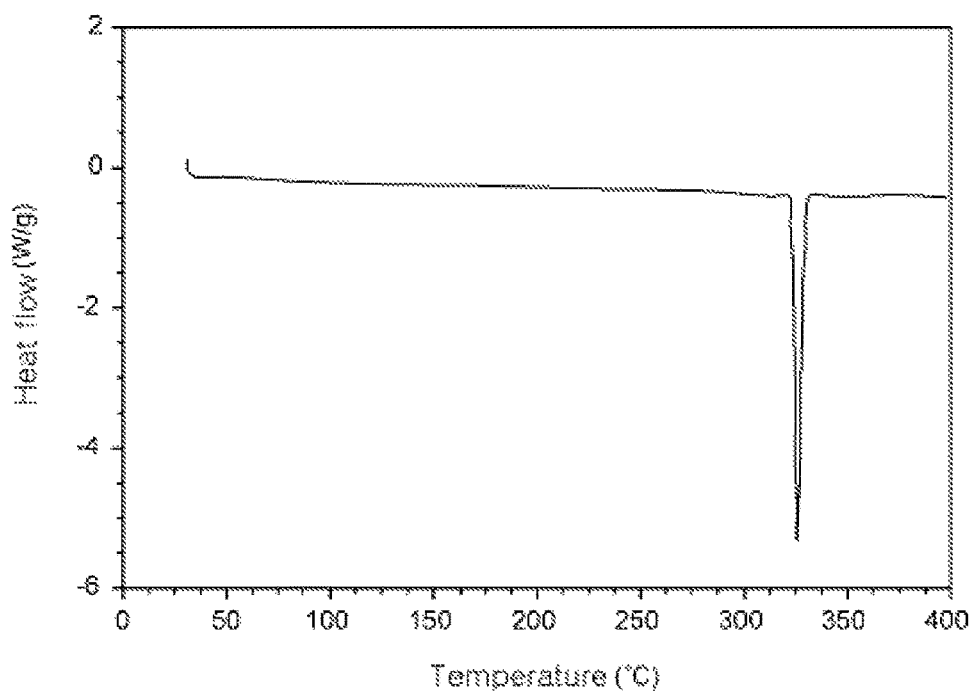

Referring to (a) of FIG. 6A, the compound 1-51 has a glass-transition temperature of about 163° C., and referring to (b) of FIG. 6A, the compound 1-51 has a melting temperature of about 352° C. Referring to (a) of FIG. 6B, the compound 1-49 has a glass-transition temperature of about 145° C., and referring to (b) of FIG. 6B, the compound 1-49 has a melting temperature of about 332° C. Referring to (a) of FIG. 6C, the compound 1-4 has a glass-transition temperature of about 124° C., and referring to (b) of FIG. 6C, the compound 1-4 has a melting temperature of about 289° C.

A compound according to an exemplary embodiment of the present invention has high thermal stability with a high glass-transition temperature and a high melting temperature. As such, a high-efficiency organic light-emitting diode can be realized.

The present invention can improve driving voltage because more electrons are injected into a light-emitting part by minimizing the difference in energy level between an n-type charge generation layer and a p-type charge generation layer. Moreover, even in the case of an n-type charge generation layer doped with an alkali metal, the present invention can improve the lifetime of an organic light-emitting diode by minimizing diffusion of the alkali metal into the p-type charge generation layer from the n-type charge generation layer.

And, the organic light-emitting display device, to which the organic layer including the compound is applied, is further improved than the organic light-emitting display device, to which an organic layer not including the compound is applied, in the electron injection of the anode direction or the hole injection of the cathode direction and relatively increases the emission efficiency and the lifetime.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light-emitting diode comprising:
   at least one light-emitting part between an anode and a cathode, the at least one light-emitting part having at least one organic layer and an emissive layer,
   wherein the at least one organic layer is composed of a compound having one or more heteroatoms,
   wherein the at least one organic layer includes a charge generation layer,
   wherein the charge generation layer includes an n-type charge generation layer comprising the compound,
   wherein the compound has an energy level due to the heteroatoms and conductive characteristics due to the energy level, and
   wherein the compound is represented by the following Chemical Formula 1:

[Chemical Formula 1]

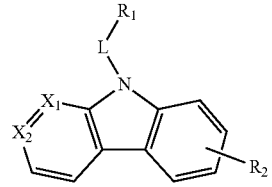

where $X_1$ and $X_2$ are carbon or nitrogen, at least one of $X_1$ and $X_2$ is nitrogen, L is a single bond, a substituted or unsubstituted C1 to C60 arylene group, or a substituted or unsubstituted 5-membered to 60-membered heteroarylene group containing one or more heteroatoms selected from nitrogen, oxygen, and sulfur, $R_1$ is a substituted or unsubstituted C6 to C60 aryl group, a substituted or unsubstituted 5-membered to 60-membered heteroaryl group containing one or more heteroatoms selected from nitrogen, oxygen, and sulfur, or a C1 to C20 alkyl group, and $R_2$ is a substituted or unsubstituted C6 to C60 aryl group, a substituted or unsubstituted 5-membered to 60-membered heteroaryl group containing one or more heteroatoms selected from nitrogen, oxygen, and sulfur, an arylamine group, or a secondary amine group, with the proviso that when $R_2$ is an unsubstituted C6 to C60 aryl group, $R_2$ is not anthracene-based, and when R₂ is a substituted aryl group, neither the aryl group nor the substituent is anthracene-based.

2. The organic light-emitting diode of claim 1, wherein the at least one organic layer further comprises an electron transporting layer comprising the compound.

3. The organic light-emitting diode of claim 2, wherein electrons are transported from the electron transporting layer to the emissive layer due to the energy level.

4. The organic light-emitting diode of claim 1, wherein the charge generation layer further includes a p-type charge generation layer.

5. The organic light-emitting diode of claim 1, wherein the n-type charge generation layer includes an alkali metal and has the conductive characteristics by forming a chemical bond with an alkali metal and a non-covalent electron pair of a nitrogen atom, which is one of the heteroatoms.

6. The organic light-emitting diode of claim 1, wherein the $R_1$ is a substituted or unsubstituted 5-membered to 60-membered heteroaryl group having heteroatoms and the heteroatoms includes a nitrogen atom.

7. The organic light-emitting diode of claim 1, wherein $X_1$ includes nitrogen, and $X_2$ includes carbon.

8. The organic light-emitting diode of claim 1, wherein L includes a single bond.

9. The organic light-emitting diode of claim 1, wherein $R_2$ is a substituted or unsubstituted C6 to C60 aryl group, or a substituted or unsubstituted 5-membered to 60-membered heteroaryl group having one or more heteroatoms selected from nitrogen, oxygen, and sulfur, with the proviso that when $R_2$ is an unsubstituted C6 to C60 aryl group, $R_2$ is not anthracene-based, and when $R_2$ is a substituted aryl group, neither the aryl group nor the substituent is anthracene-based.

10. The organic light-emitting diode of claim 1, wherein the compound represented by the above Chemical Formula 1 is represented by any one of the following compounds:

1-1
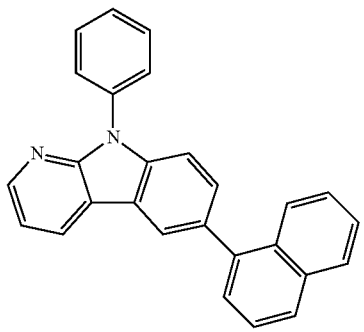

1-2
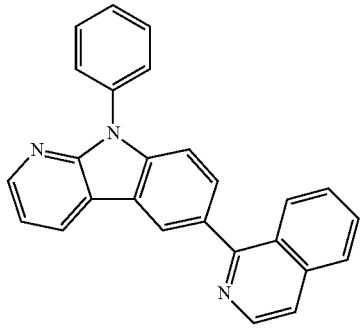

1-3
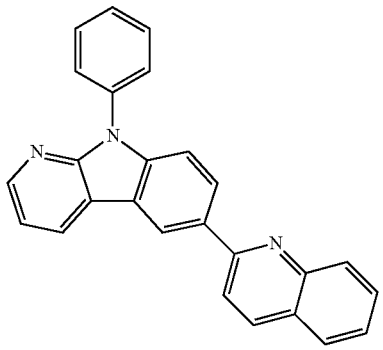

1-4
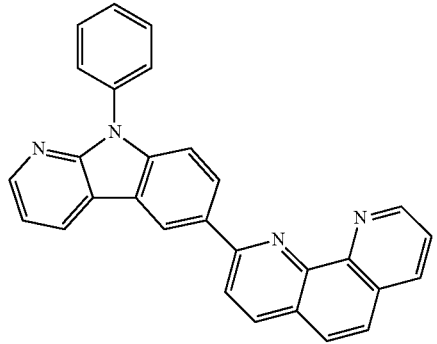

1-5
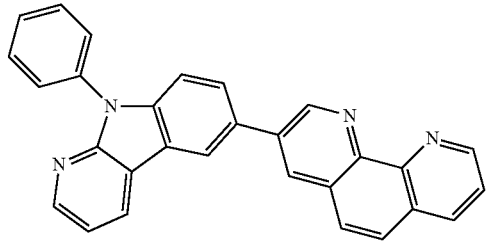

1-6
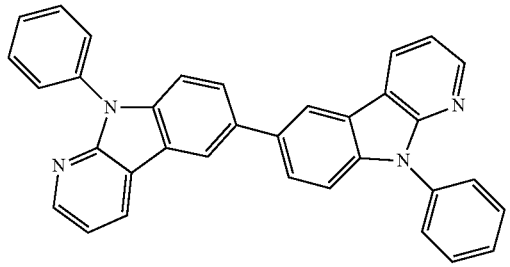

1-7
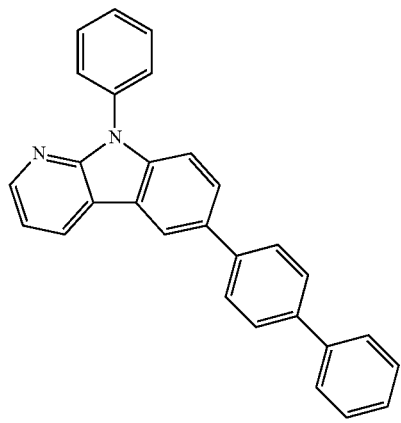
1-8
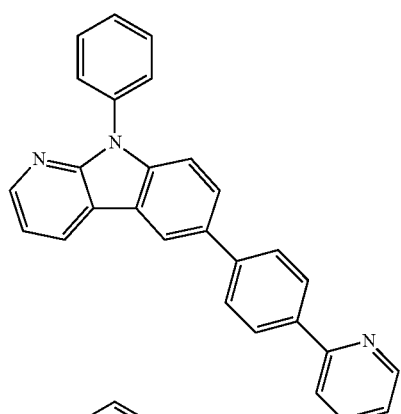
1-9
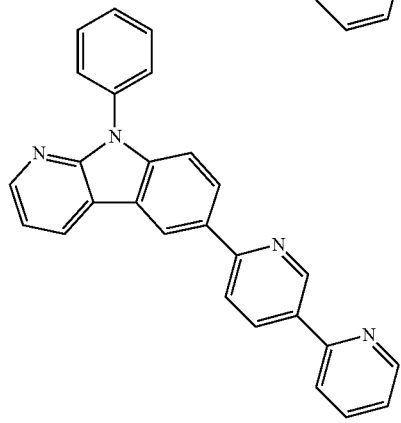
1-10
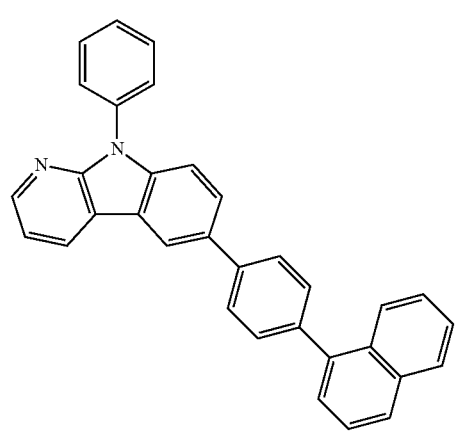
1-11
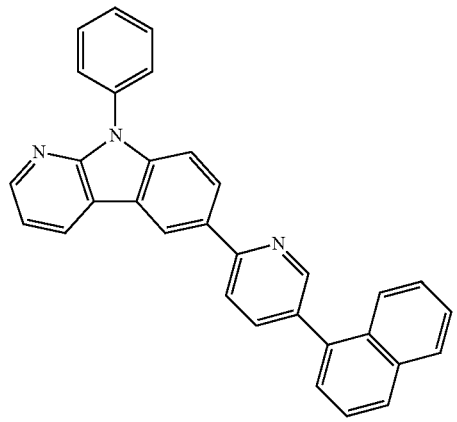
1-12
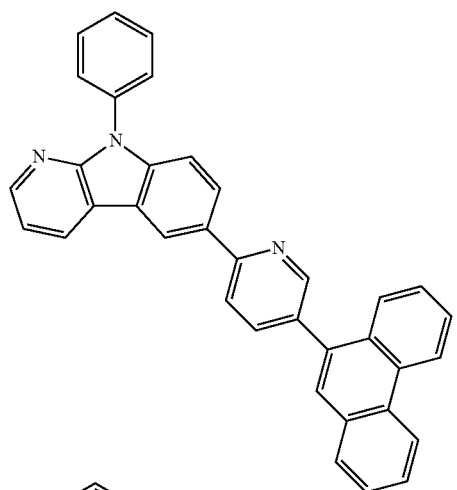
1-13
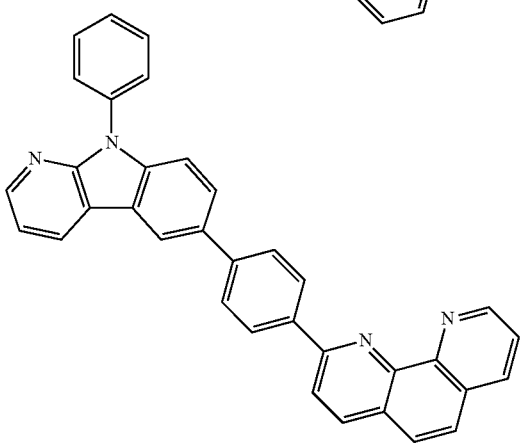
1-14
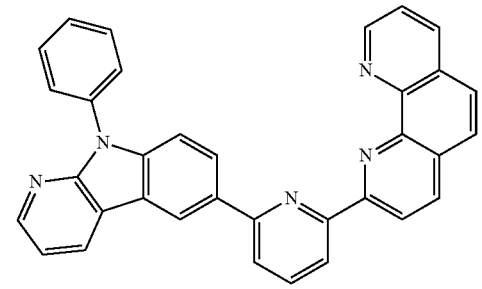

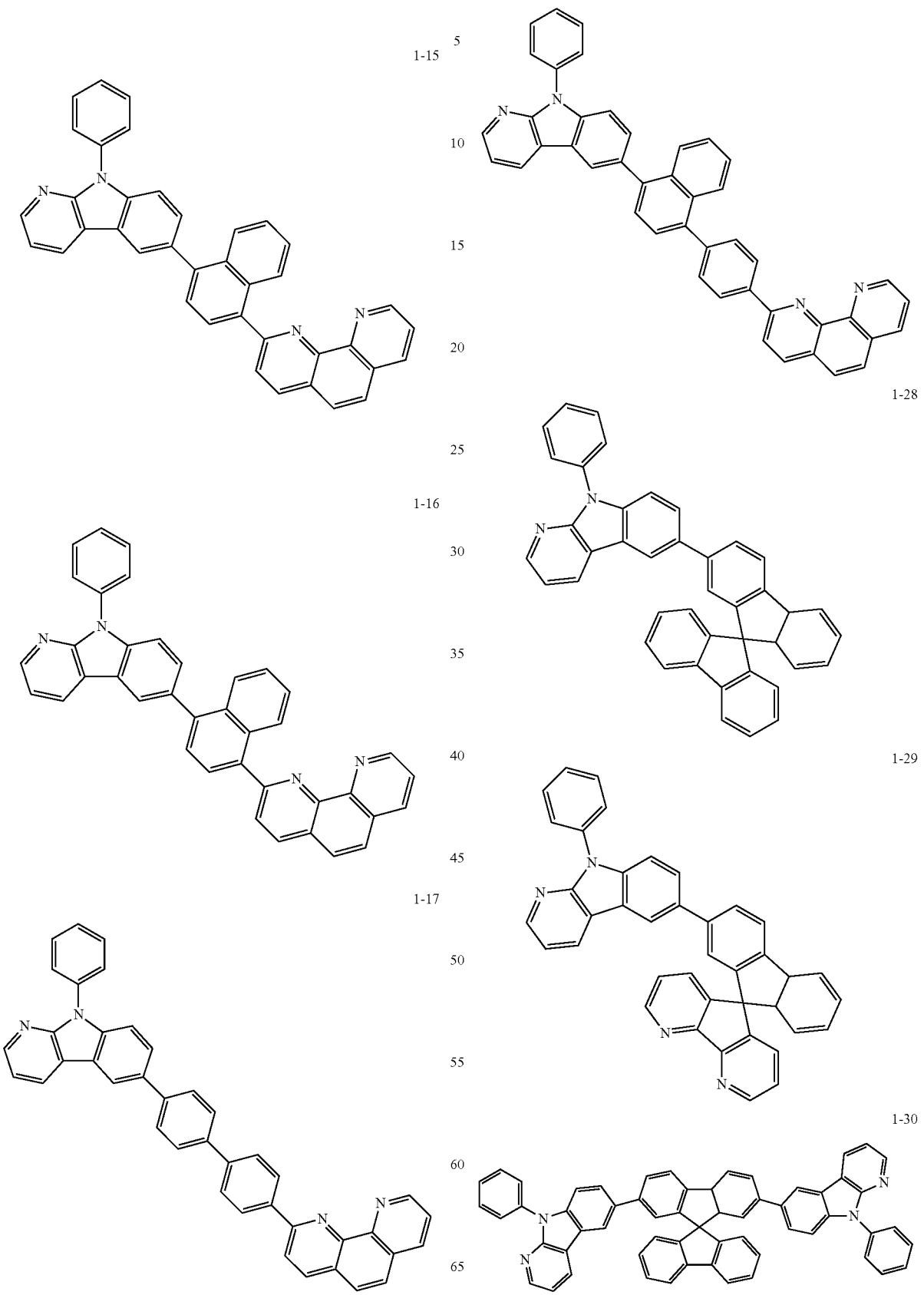

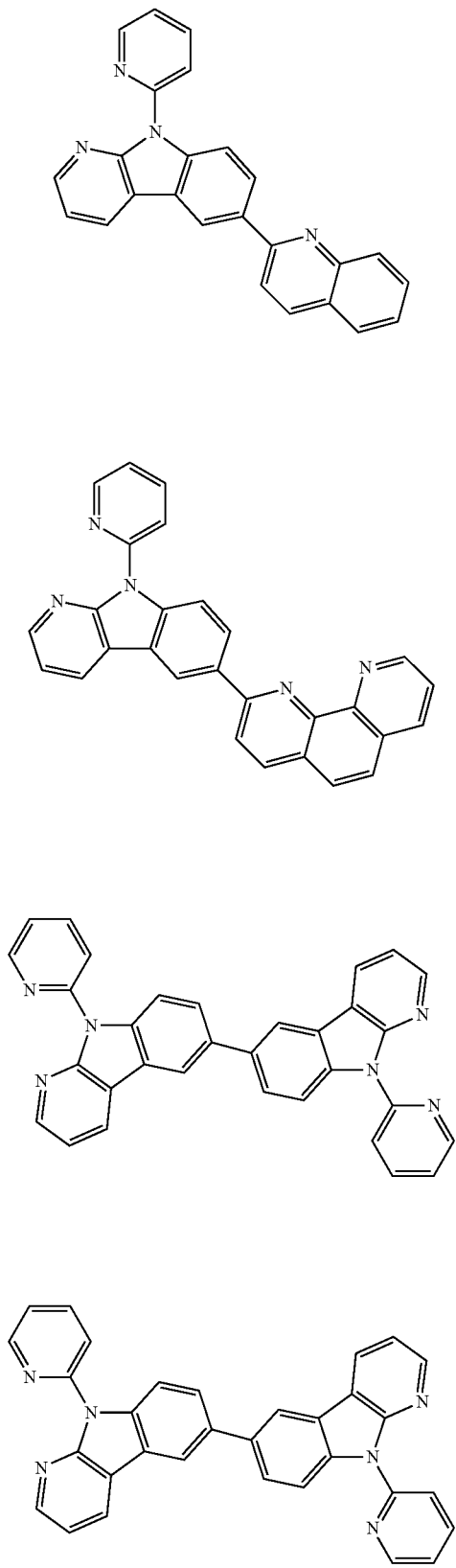
1-31
1-32
1-33
1-35
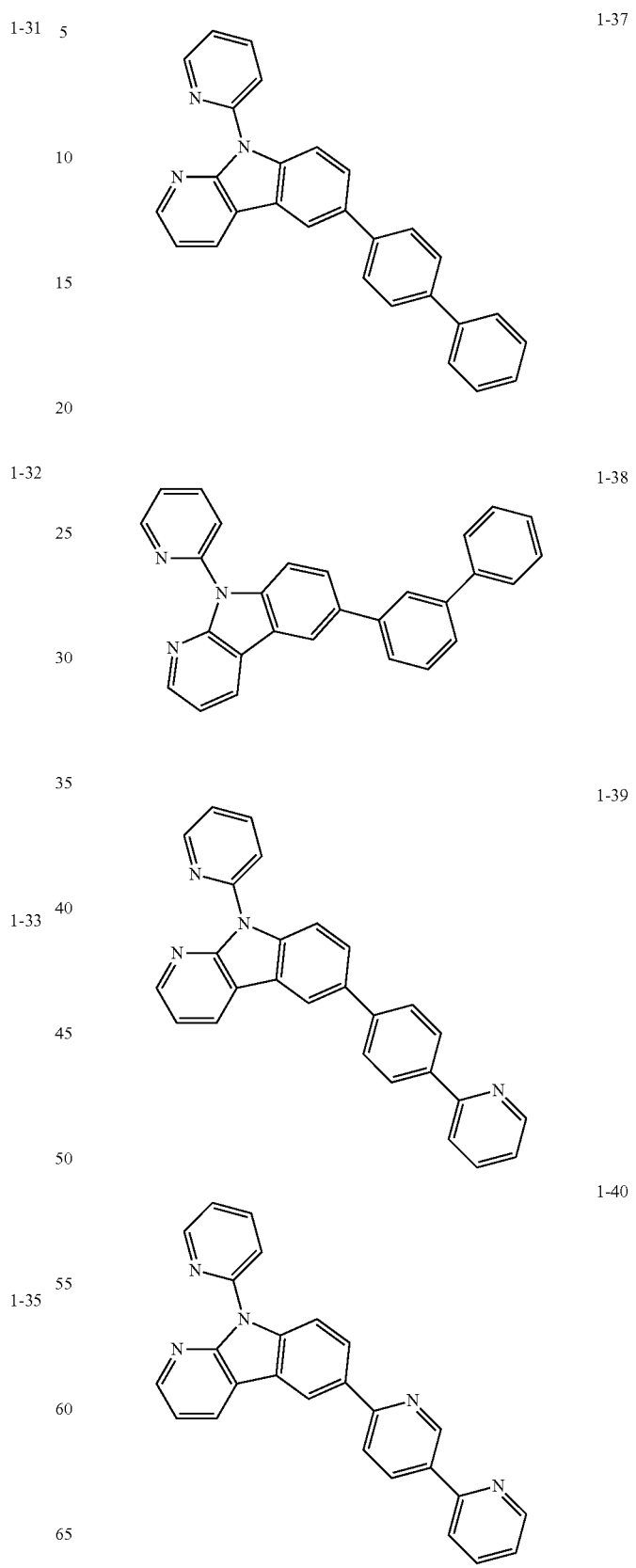
1-37
1-38
1-39
1-40

1-41
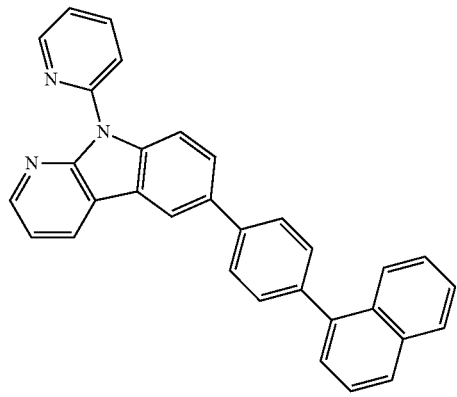
1-42
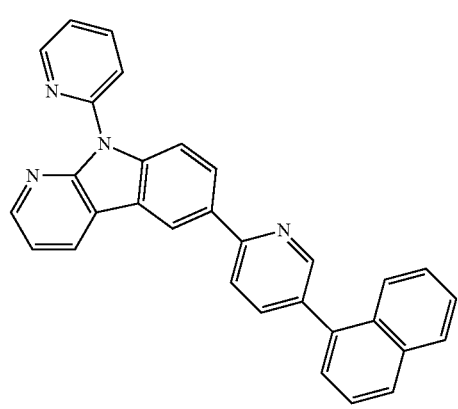
1-43
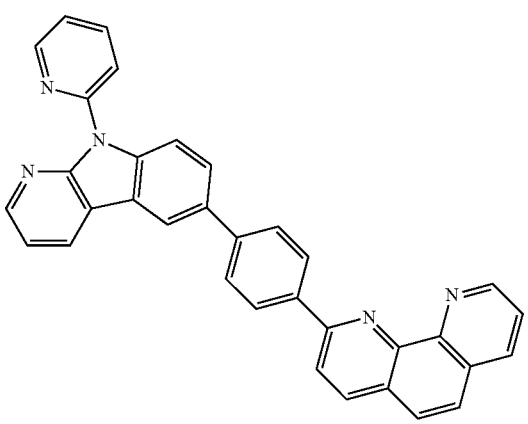
1-44
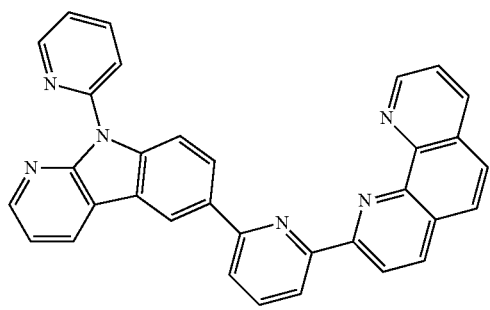
1-45
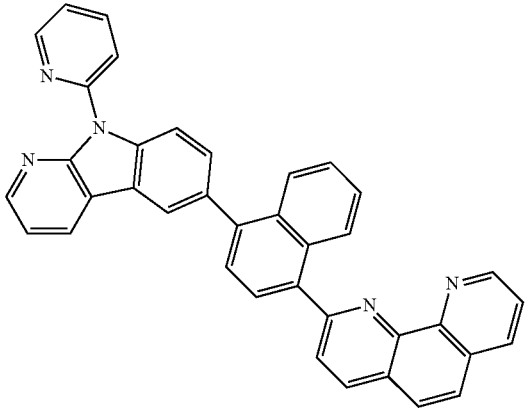
1-46
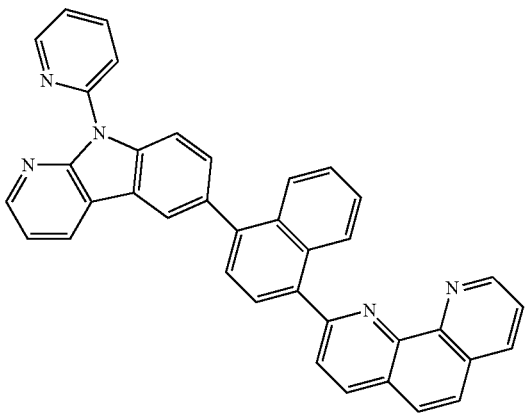
1-47
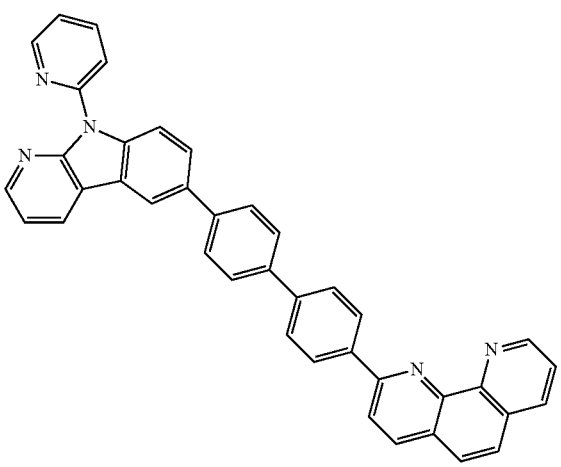

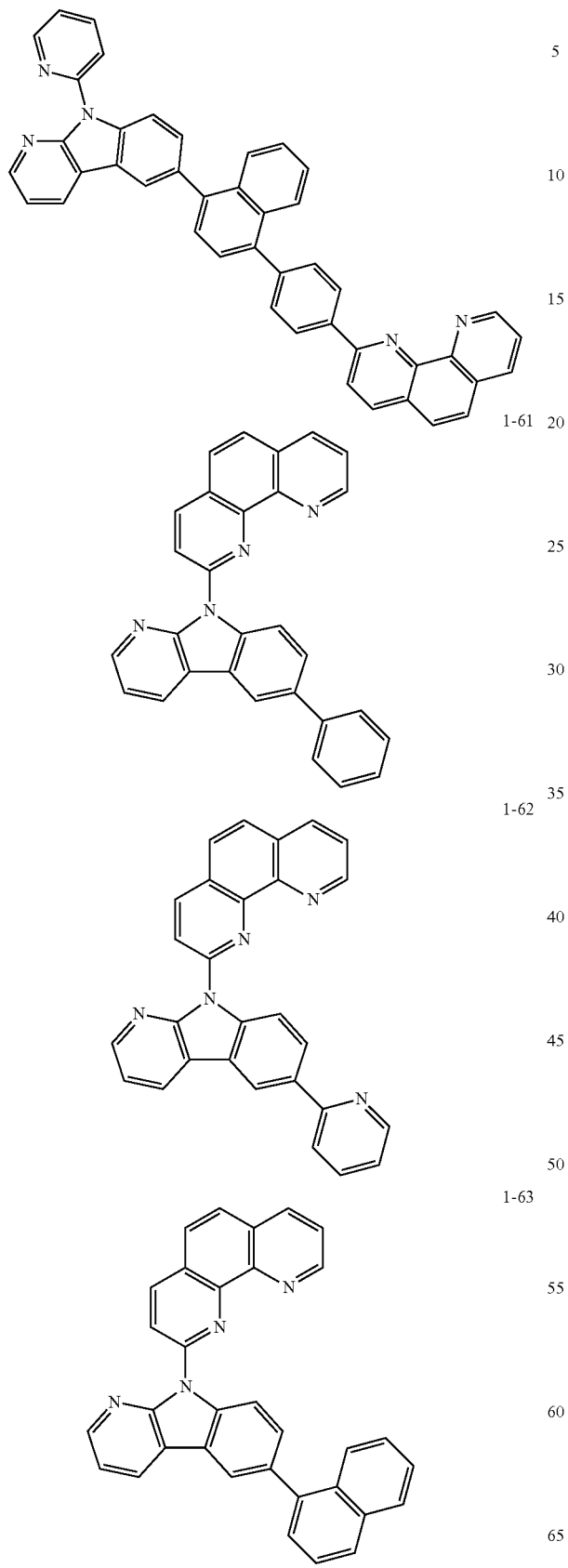
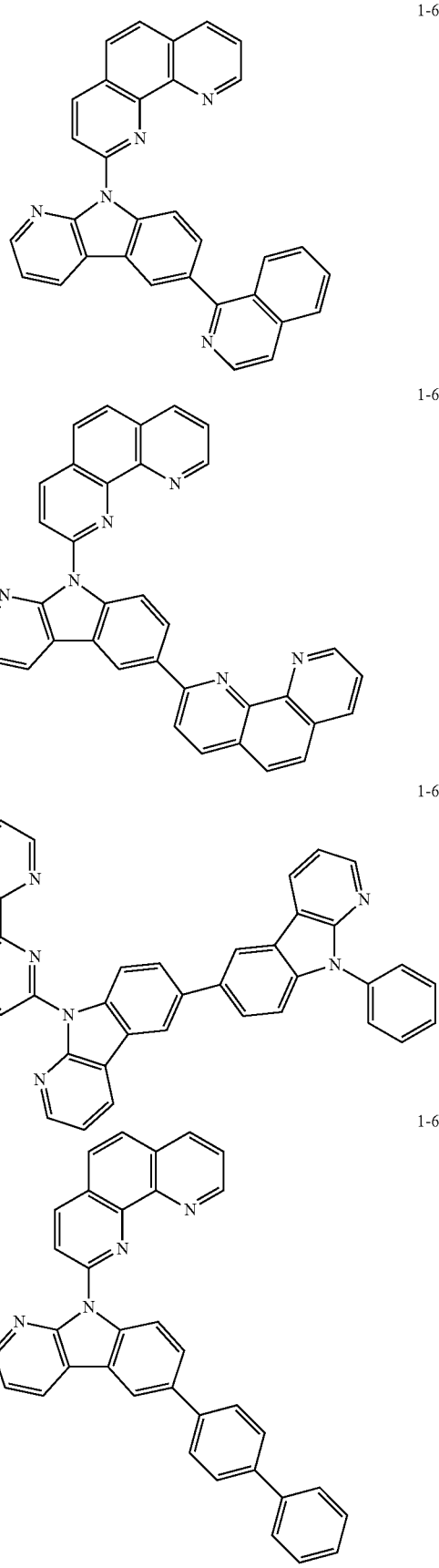

1-68
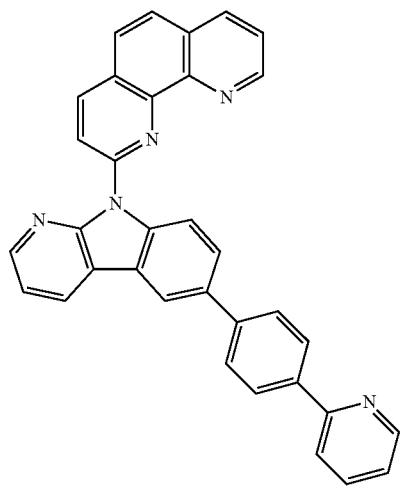
1-69
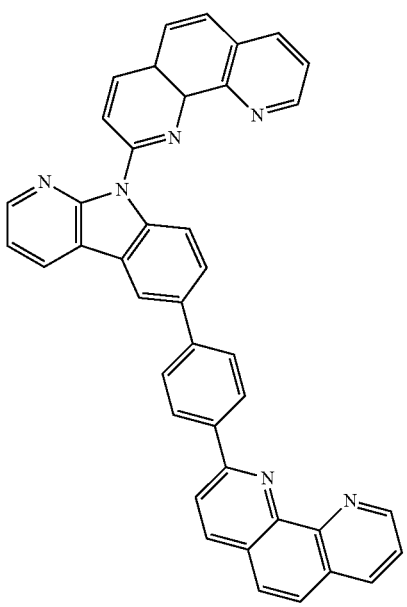
1-70
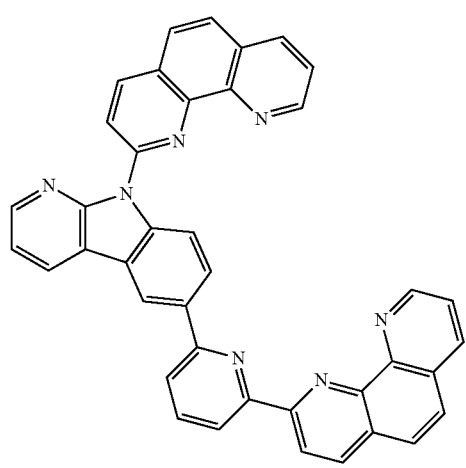
1-77
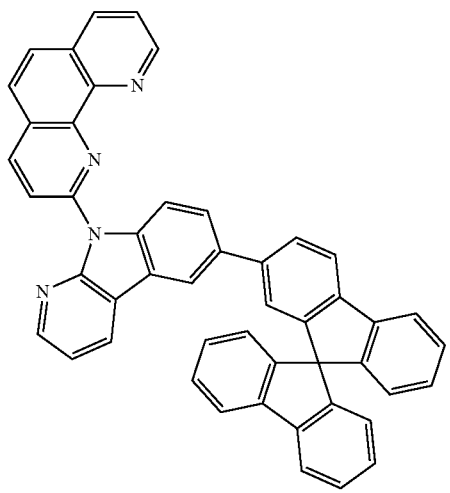
1-79
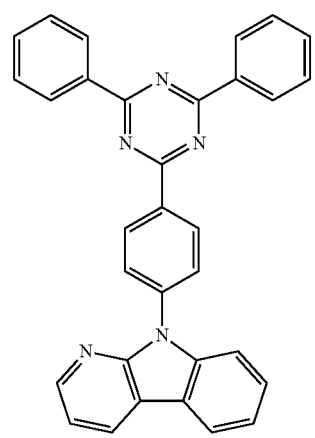
1-80
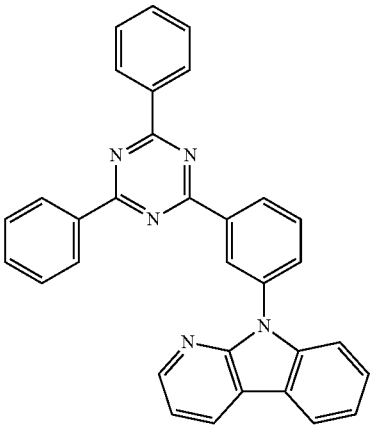

1-81
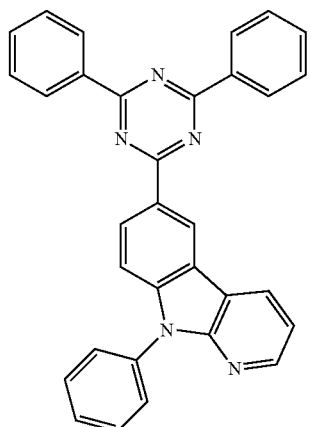
1-82
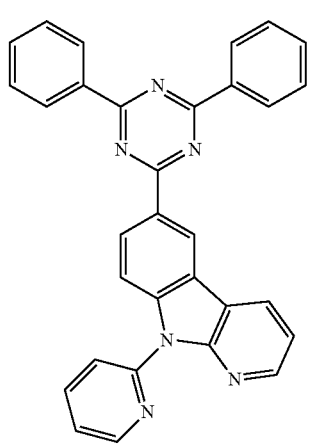
1-83
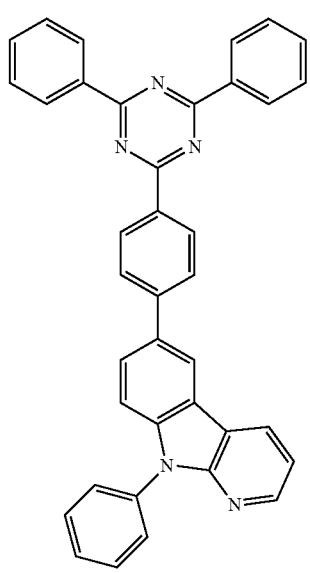
1-84
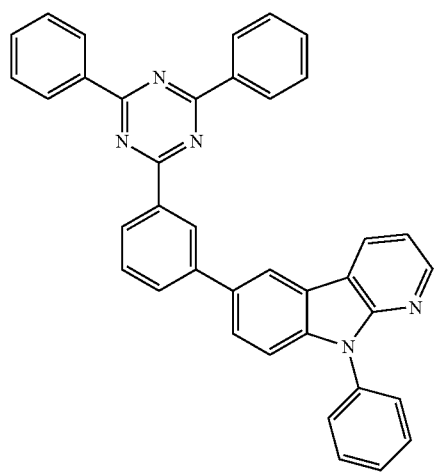
1-85
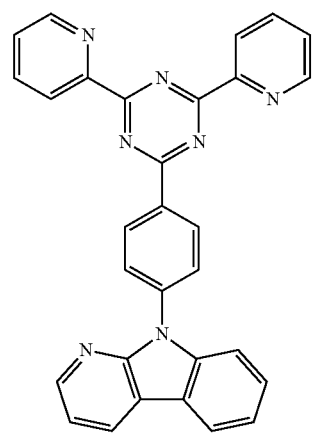
1-86
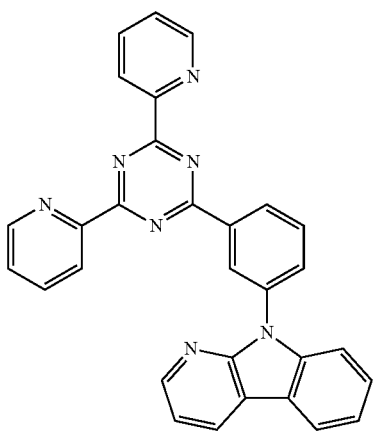

1-87
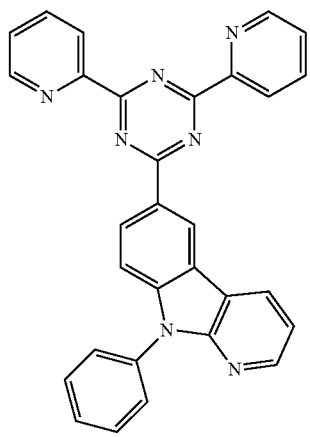
1-88
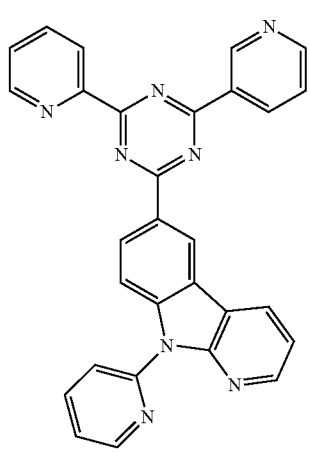
1-89
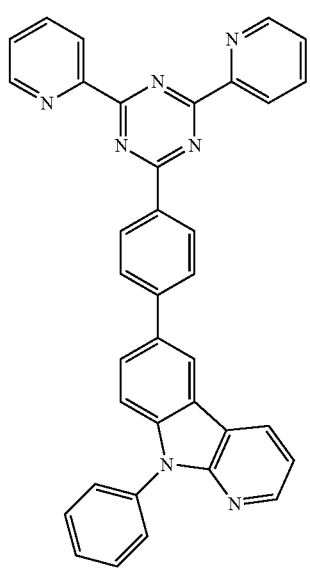
1-90
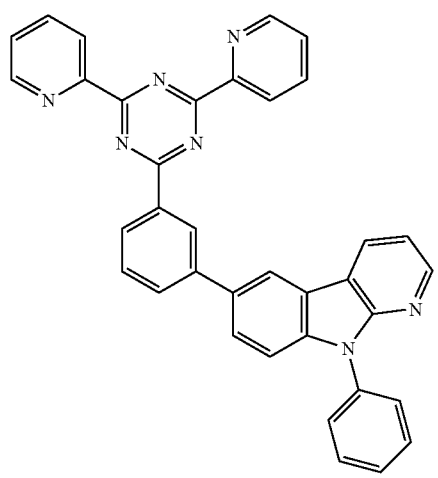
1-91
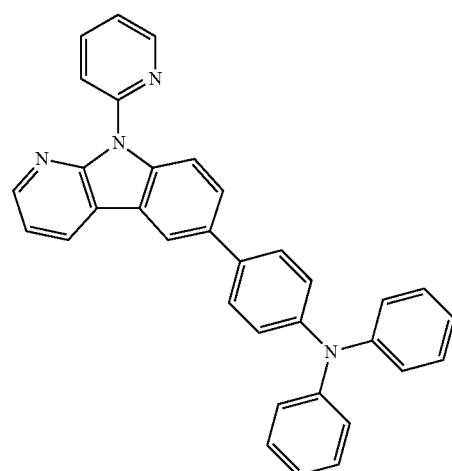
1-92
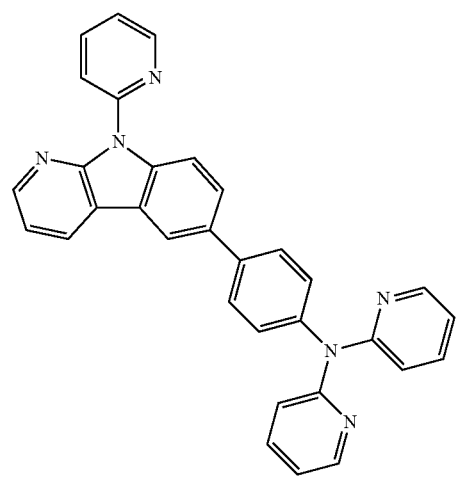

1-93
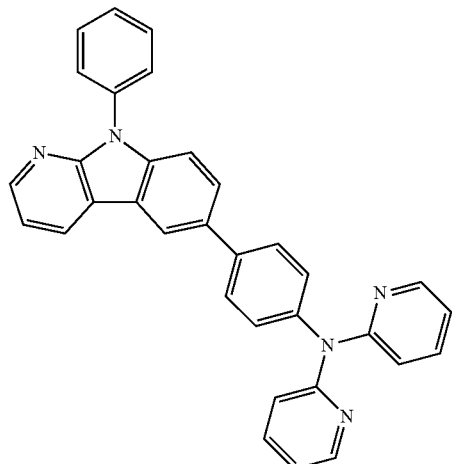
1-94
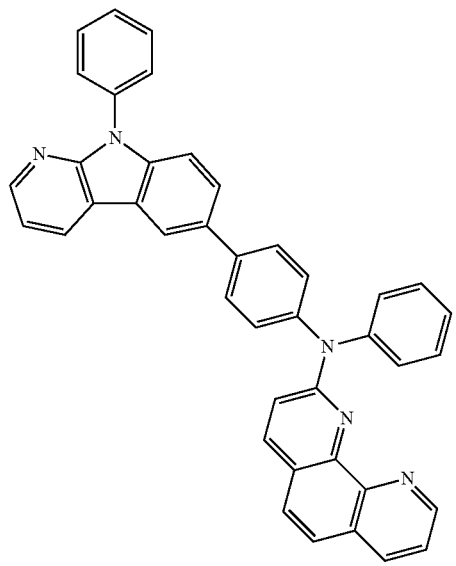
1-95
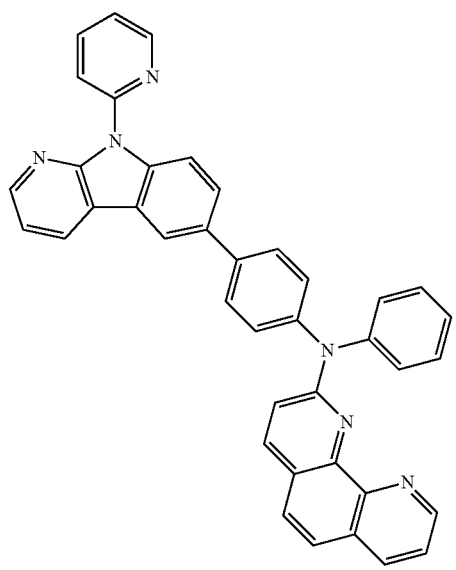
1-96
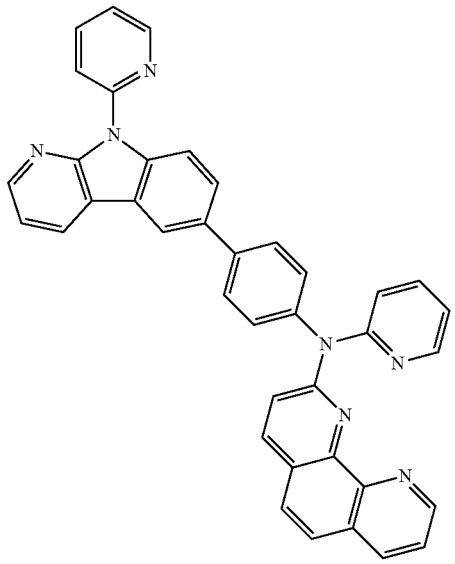
1-97
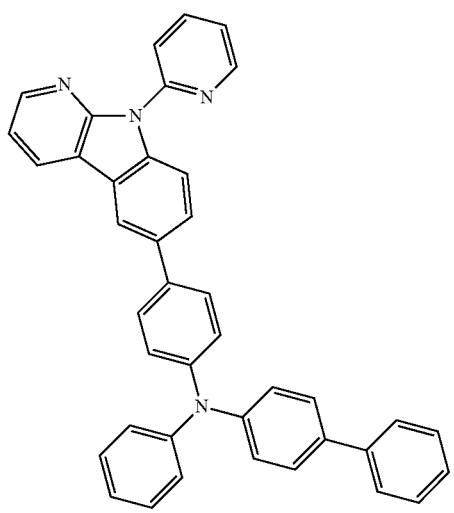
1-98
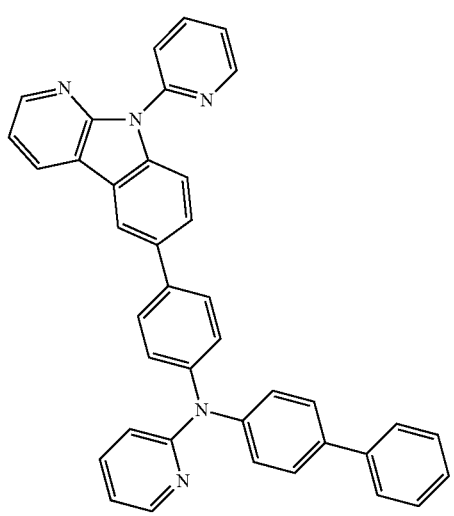

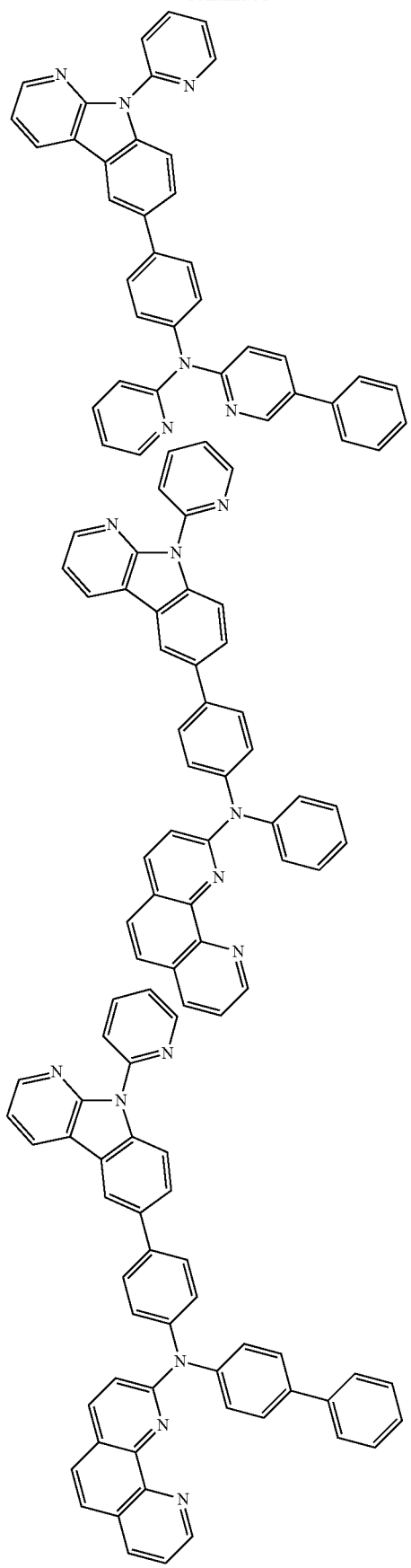

1-99

1-100

1-101

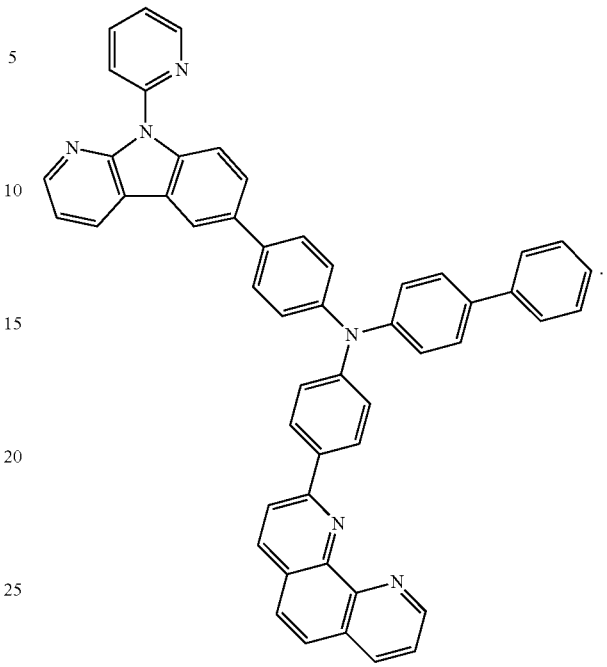

1-102

11. The organic light-emitting diode of claim 1, wherein at least one of $X_1$ and $X_2$ of the compound is nitrogen atom, and the compound has the conductive characteristics due to the nitrogen.

12. The organic light-emitting diode of claim 11, wherein electrons are transported from the charge generation layer to the electron transporting layer due to the conductive characteristics.

13. The organic-light emitting diode of claim 1, wherein an organic light-emitting display having the compound implemented in the organic layer exhibits enhanced electron injection in the anode direction or enhanced hole injection in the cathode direction, and exhibits increased emission efficiency and increased display lifetime, when compared to an organic light-emitting display without the compound implemented in the organic layer.

14. An organic light-emitting diode comprising:
an anode;
a cathode; and
at least one organic layer between the anode and the cathode,
wherein the at least one organic layer includes a charge generation layer,
wherein the charge generation layer includes an n-type charge generation layer having a compound represented by the following Chemical Formula 1:

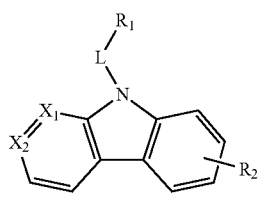

where $X_1$ and $X_2$ are carbon or nitrogen, at least one of $X_1$ and $X_2$ is nitrogen, L is a single bond, a substituted or unsubstituted C1 to C60 arylene group, or a substituted or unsubstituted 5-membered to 60-membered heteroarylene group containing one or more heteroatoms selected from nitrogen, oxygen, and sulfur, $R_1$ is a substituted or unsubstituted C6 to C60 aryl group, a substituted or unsubstituted 5-membered to 60-membered heteroaryl group containing one or more heteroatoms selected from nitrogen, oxygen, and sulfur, or a C1 to C20 alkyl group, and $R_2$ is a substituted or unsubstituted C6 to C60 aryl group, a substituted or unsubstituted 5-membered to 60-membered heteroaryl group containing one or more heteroatoms selected from nitrogen, oxygen, and sulfur, an arylamine group, or a secondary amine group, with the proviso that when $R_2$ is an unsubstituted C6 to C60 aryl group, $R_2$ is not anthracene-based, and when $R_2$ is a substituted aryl group, neither the aryl group nor the substituent is anthracene-based.

15. The organic light-emitting diode of claim 14, wherein the charge generation layer further includes a p-type charge generation layer.

16. The organic light-emitting diode of claim 14, wherein the at least one organic layer further includes an electron transporting layer having the compound.

17. The organic light-emitting diode of claim 14, wherein the at least one organic layer comprises:
a first light-emitting part including a first emissive layer; and
a second light-emitting part including a second emissive layer,
wherein the charge generation layer is disposed over the first light emitting part.

18. The organic light-emitting diode of claim 14, wherein the at least one organic layer comprises:
a first light-emitting part including a first emissive layer;
a second light-emitting part including a second emissive layer;
a third light-emitting part including a third emissive layer,
wherein the charge generation layer includes a first charge generation layer and a second charge generation layer, and
wherein the first charge generation layer is disposed over the first light emitting part and the second charge generation layer is disposed over the second light emitting part.

19. The organic light-emitting diode of claim 14, wherein at least one of $X_1$ and $X_2$ is nitrogen and the compound is doped with an alkali metal, and a chemical bond is formed between non-covalent electron pairs of the nitrogen atom and the alkali metal.

20. The organic light-emitting diode of claim 19, wherein at least one of $X_1$ and $X_2$ of the compound is nitrogen, and the compound has conductive characteristics due to the nitrogen.

21. The organic light-emitting diode of claim 20, wherein a nitrogen atom substituted at a position closer than at least one of $X_1$ and $X_2$ facilitates the electron transfer or the electron injection to the charge generation layer or the electron transporting layer, compared to a nitrogen atom substituted at a position farther than at least one of $X_1$ and $X_2$.

* * * * *